US012776387B2

(12) United States Patent
Shin et al.

(10) Patent No.: US 12,776,387 B2
(45) Date of Patent: Oct. 27, 2026

(54) MEMORY DEVICE USING DATA LATCH

(71) Applicant: SAMSUNG ELECTRONICS CO., LTD., Suwon-si (KR)

(72) Inventors: Seo-Hyun Shin, Suwon-si (KR); Kyungduk Lee, Suwon-si (KR); Daehyeon Jo, Suwon-si (KR); Youngsik Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 96 days.

(21) Appl. No.: 18/792,170

(22) Filed: Aug. 1, 2024

(65) Prior Publication Data

US 2025/0226053 A1 Jul. 10, 2025

(30) Foreign Application Priority Data

Jan. 4, 2024 (KR) ........................ 10-2024-0001683

(51) Int. Cl.
*G11C 29/00* (2006.01)

(52) U.S. Cl.
CPC ............ *G11C 29/789* (2013.01); *G11C 29/76* (2013.01)

(58) Field of Classification Search
CPC .............................. G11C 29/789; G11C 29/76
USPC .................................................... 365/185.09
See application file for complete search history.

(56) References Cited

U.S. PATENT DOCUMENTS 7,224,605 B1 * 5/2007 Moogat ................ G11C 29/846 365/185.09
8,498,160 B2 7/2013 Kim et al.
9,466,390 B2 10/2016 Kim et al.
9,852,815 B2 12/2017 Lee
10,025,532 B2 7/2018 Manohar et al.
2006/0181924 A1 * 8/2006 Cha ...................... G11C 16/105 365/185.12
2012/0106270 A1 5/2012 Park
2014/0169092 A1 * 6/2014 Miyamoto .......... G06F 11/1048 365/185.05
2014/0380116 A1 * 12/2014 Hirano .................. G11C 29/78 714/758
2017/0278580 A1 * 9/2017 Lim .................... G06F 11/2094
2022/0051729 A1 * 2/2022 Cho ................... G11C 16/0483

FOREIGN PATENT DOCUMENTS

JP 4408366 2/2010
JP 5085463 11/2012
JP 2017-162048 9/2017
KR 10-2529333 5/2023

OTHER PUBLICATIONS

Extended European Search Report in European Appln. No. 24213893.1, mailed on May 15, 2025, 11 pages.

* cited by examiner

*Primary Examiner* — Amir Zarabian
*Assistant Examiner* — Daniel John King
(74) *Attorney, Agent, or Firm* — Fish & Richardson P.C.

(57) ABSTRACT

A memory device includes a memory cell array configured to include a first memory cell for storing user data and a second memory cell for a column repair of the first memory cell; a page buffer circuit configured to include a first page buffer connected to the first memory cell and a second page buffer connected to the second memory cell; and a page buffer latch input/output circuit configured to use at least one data latch of the second page buffer as a substitute for a buffer memory during a data latch use operation.

19 Claims, 21 Drawing Sheets

MEMORY DEVICE USING DATA LATCH

CROSS-REFERENCE TO RELATED APPLICATION

This application claims priority under 35 U.S.C. § 119 to Korean Patent Application No. 10-2024-0001683 filed on Jan. 4, 2024, in the Korean Intellectual Property Office, the entirety of which is incorporated by reference herein.

BACKGROUND

A semiconductor memory may be mainly classified as a volatile memory or a non-volatile memory. Read and write speeds of the volatile memory (e.g., a DRAM or an SRAM) are fast, but the data stored in the volatile memory disappears when power is turned off. In contrast, the non-volatile memory may retain data even when the power is turned off.

A representative example of the non-volatile memory is a flash memory. The flash memory may store multi-bit data of two or more bits in one memory cell. The flash memory that stores the multi-bit data may have one erase state and a plurality of program states depending on threshold voltage distributions.

The flash memory may include a plurality of data latches within a page buffer to program multi-bit data. For example, when storing 3-bit data in one memory cell of the flash memory, the page buffer may include three data latches. When storing 4-bit data, the page buffer may include four data latches.

Among the plurality of data latches in the flash memory, there may be data latches that are not often used. For example, the flash memory may include a column repair cell for column repair when a main cell storing user data fails. The plurality of data latches in the page buffer connected to the column repair cell may not be used if a column repair operation is not performed.

SUMMARY

Some implementations according to the present disclosure provide memory devices that may use unused data latches as a substitute for a buffer memory, and storage devices including the same.

According to some implementations, a memory device includes a memory cell array configured to include a first memory cell for storing user data and a second memory cell for a column repair of the first memory cell; a page buffer circuit configured to include a first page buffer connected to the first memory cell and a second page buffer connected to the second memory cell; and a page buffer latch input/output circuit configured to use at least one data latch of the second page buffer as a substitute for a buffer memory during a data latch use operation.

According to some implementations, a memory device includes a memory cell array configured to include a first memory cell for storing user data and a second memory cell for column repair of the first memory cell; a page buffer circuit configured to include a first page buffer connected to the first memory cell and a second page buffer connected to the second memory cell; and a page buffer latch input/output circuit configured to use at least one data latch of the first page buffer as a substitute for a buffer memory when the first memory cell is failed.

According to some implementations, a storage device includes a memory device configured to include a first memory cell for storing a user data, a second memory cell for column repair of the first memory cell, a second memory cell, a first page buffer connected to the first memory cell, and a second page buffer connected to the second memory cell; and a memory controller configured to control the memory device to use at least one data latch of the first page buffer or the second page buffer as a substitute for a buffer memory during a data latch use operation.

BRIEF DESCRIPTION OF THE FIGURES

The above and other objects and features of the present disclosure will become apparent by describing in detail examples thereof with reference to the accompanying drawings.

DETAILED DESCRIPTION

Figure 1:
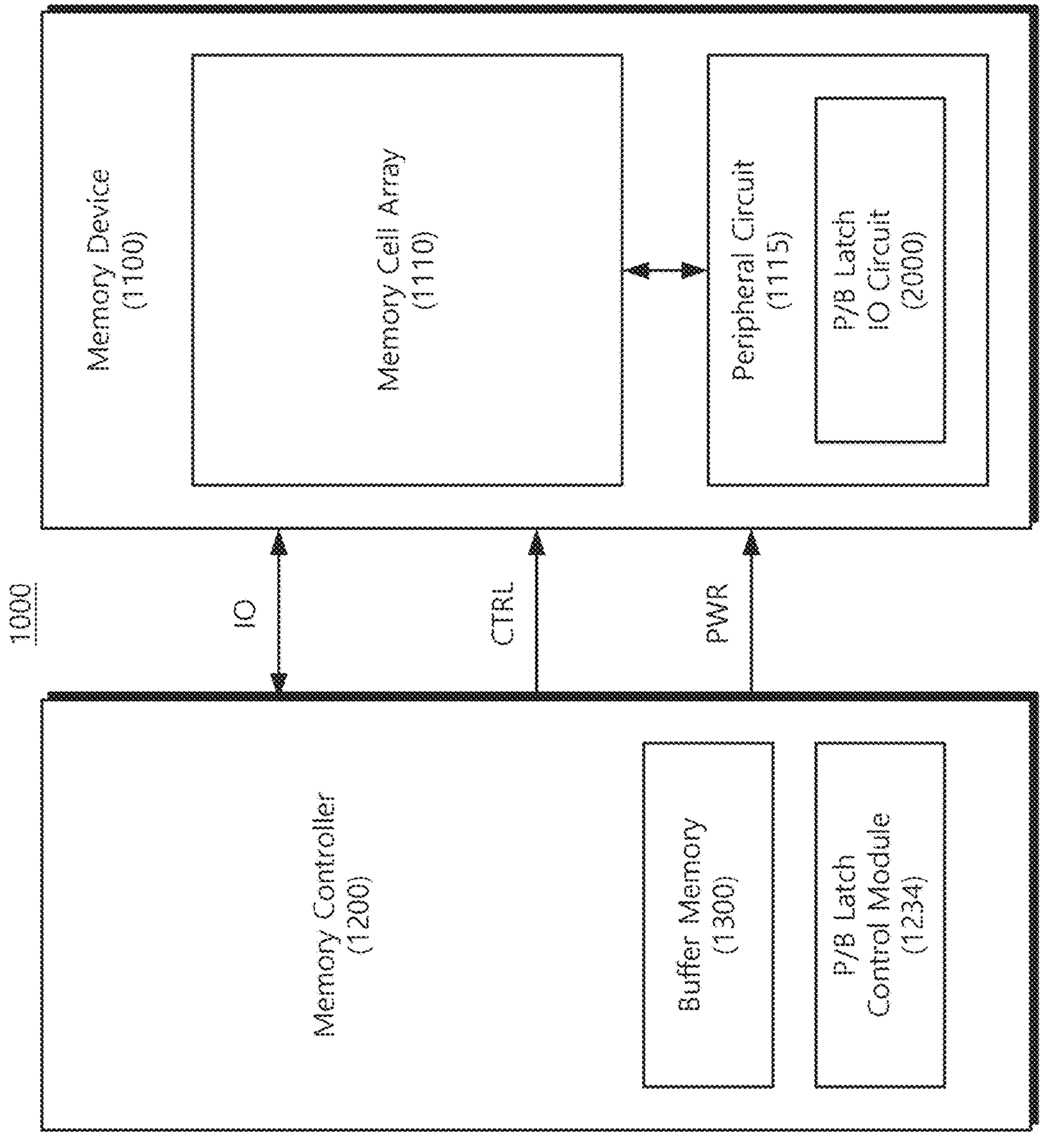
FIG. 1 is a block diagram illustrating an example of a storage device.

FIG. 1 is a block diagram illustrating a storage device according to some implementations of the present disclosure. The storage device 1000 may be a flash storage device based on a flash memory. For example, the storage device 1000 may be implemented as a solid-state drive (SSD), a universal flash storage (UFS), a memory card, or the like.

Referring to FIG. 1, the storage device 1000 may include a memory device 1100 and a memory controller 1200. The memory device 1100 may receive input/output signals IO from the memory controller 1200 through input/output lines, receive control signals CTRL through control lines, and receive external power supply PWR through power lines. The storage device 1000 may store data in the memory device 1100 under the control of the memory controller 1200.

The memory device 1100 may include a memory cell array 1110 and a peripheral circuit 1115. The memory cell array 1110 may have a vertical 3D structure. The memory cell array 1110 may include a plurality of memory cells. Multi-bit data may be stored in each memory cell.

The memory cell array 1110 may be located (e.g., disposed) next to or above the peripheral circuit 1115 in terms of the design layout structure. A structure in which the memory cell array 1110 is positioned over the peripheral circuit 1115 may be referred to as a cell on peripheral (COP) structure.

The memory cell array 1110 may be manufactured as a chip separate from the peripheral circuit 1115. An upper chip including the memory cell array 1110 and a lower chip including the peripheral circuit 1115 may be connected to each other by a bonding method. Such a structure may be referred to as a chip-to-chip (C2C) structure.

The peripheral circuit 1115 may include analog circuits and/or digital circuits used to store data in the memory cell array 1110 and/or read data stored in the memory cell array 1110. The peripheral circuit 1115 may receive the external power PWR through power lines and generate internal powers of various levels.

The peripheral circuit 1115 may receive commands, addresses, and/or data from the memory controller 1200 through input/output lines. The peripheral circuit 1115 may store data in the memory cell array 1110 according to the control signals CTRL. Alternatively or additionally, the peripheral circuit 1115 may read data stored in the memory cell array 1110 and provide the read data to the memory controller 1200. The peripheral circuit 1115 may include a page buffer latch input/output circuit 2000.

The memory controller 1200 may include a page buffer latch control module 1234 and a buffer memory 1300. The page buffer latch control module 1234 may control the data latch use operation of the page buffer latch input/output circuit 2000. The page buffer latch control module 1234 may use the data latch in the peripheral circuit 1115 of the memory device 1100 like the buffer memory 1300 through a data latch use operation.

According to some implementations of the present disclosure, by using the data latch of the peripheral circuit 1115 as if it were the buffer memory 1300, the amount of data storage may be increased without increasing the storage space of the buffer memory 1300.

Figure 2:
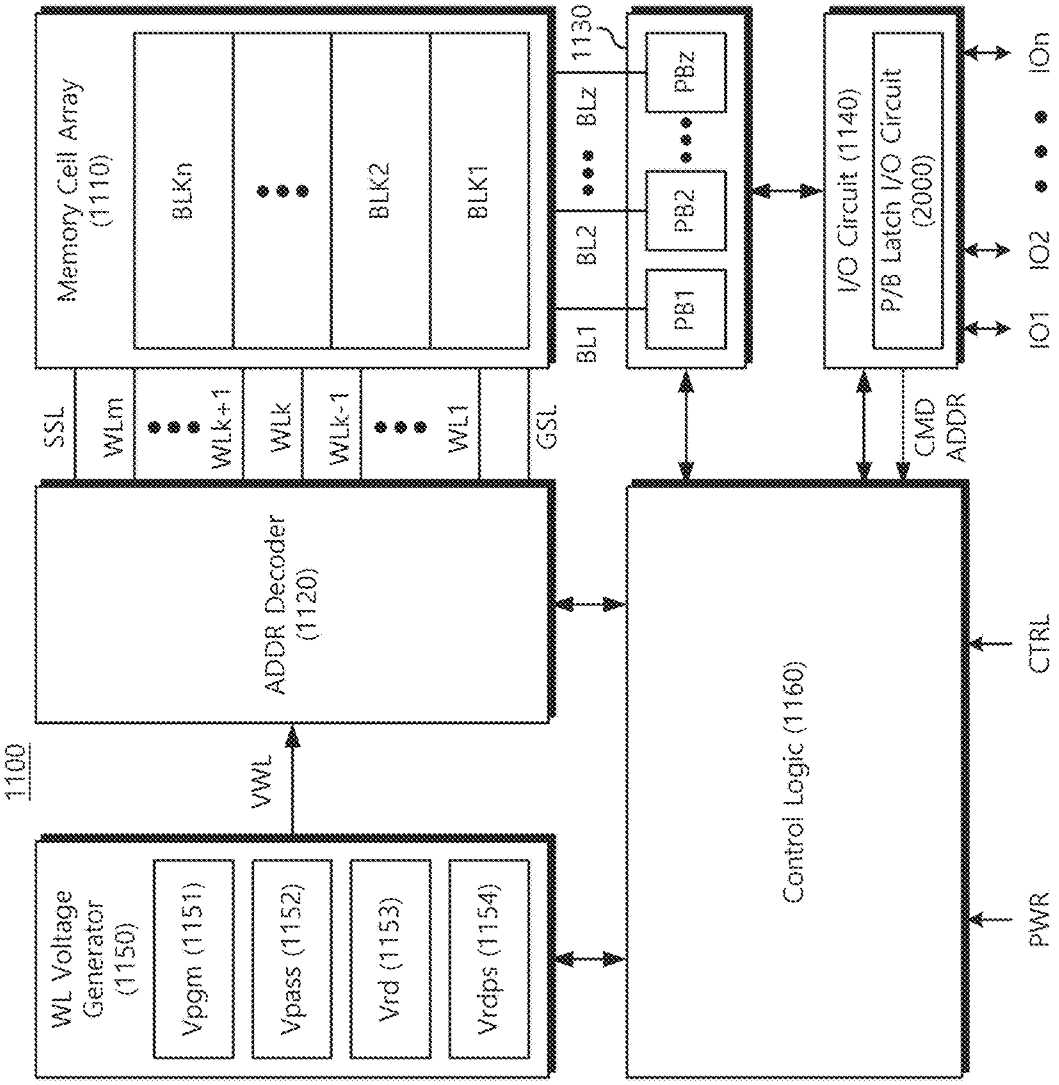
FIG. 2 is a block diagram illustrating an example of a memory device.

FIG. 2 is a block diagram illustrating an example of a memory device, e.g., the memory device 1100 illustrated in FIG. 1. Referring to FIG. 2, the memory device 1100 may include the memory cell array 1110 and the peripheral circuit 1115 (see FIG. 1). The peripheral circuit 1115 may include an address decoder 1120 (e.g., a circuit), a page buffer circuit 1130, a data input/output circuit 1140, a word line voltage generator 1150 (e.g., a circuit), and a control logic 1160 (e.g., a circuit).

The memory cell array 1110 may include a plurality of memory blocks BLK1 to BLKn. Each memory block may include a plurality of pages. Each page may include a plurality of memory cells. Each memory cell may store multi-bit data (e.g., two or more bits). Each memory block may correspond to an erase unit, and each page may correspond to a read and/or write unit.

The memory cell array 1110 may be formed in a direction perpendicular to a substrate. A gate electrode layer and an insulation layer may be alternately deposited on the substrate. Each memory block (e.g., BLK1) may be connected to one or more string selection lines SSL, a plurality of word lines WL1 to WLm, and one or more ground selection lines GSL. WLk is a selected word line sWL and the remaining word lines (WL1 to WLk−1, WLk+1 to WLm) are unselected word lines uWL.

The address decoder 1120 may be connected to the memory cell array 1110 through selection lines SSL and GSL and word lines WL1 to WLm. The address decoder 1120 may select a word line during a program or read operation. The address decoder 1120 may receive the word line voltage VWL from the word line voltage generator 1150 and provide a program voltage or read voltage to the selected word line.

The page buffer circuit 1130 may be connected to the memory cell array 1110 through bit lines BL1 to BLz. The page buffer circuit 1130 may temporarily store data to be stored in the memory cell array 1110 or data read from the memory cell array 1110. The page buffer circuit 1130 may include page buffers PB1 to PBz connected to respective bit lines. Each page buffer may include a plurality of latches to store or read multi-bit data.

The input/output circuit 1140 may be internally connected to the page buffer circuit 1130 through data lines and externally connected to the memory controller 1200 (refer to FIG. 1) through the input/output lines IO1 to IOn. The input/output circuit 1140 may receive program data from the memory controller 1200 during a program operation. Also, the input/output circuit 1140 may provide data read from the memory cell array 1110 to the memory controller 1200 during a read operation.

The word line voltage generator 1150 may receive internal power from the control logic 1160 and generate a word line voltage VWL used to read or write data. The word line voltage VWL may be provided to a selected word line (sWL) or unselected word lines (uWL) through the address decoder 1120.

The word line voltage generator 1150 may include a program voltage generator 1151 and a pass voltage generator 1152. The program voltage generator 1151 may generate a program voltage Vpgm provided to the selected word line sWL during a program operation. The pass voltage generator 1152 may generate a pass voltage Vpass provided to the selected word line sWL and the unselected word lines uWL.

The word line voltage generator 1150 may include a read voltage generator 1153 and a read pass voltage generator 1154. The read voltage generator 1153 may generate a select read voltage Vrd provided to the select word line sWL during a read operation. The read pass voltage generator 1154 may generate a read pass voltage Vrdps provided to unselected word lines uWL. The read pass voltage Vrdps may be a voltage sufficient to turn on memory cells connected to the unselected word lines uWL during a read operation.

The control logic 1160 may control operations such as read, write, and erase of the memory device 1100 using commands CMD, addresses ADDR, and control signals CTRL provided from the memory controller 1200. The addresses ADDR may include a block selection address for selecting one memory block, a row address for selecting one page, and a column address for selecting one memory cell.

Referring to FIG. 2, the input/output circuit 1140 may include a page buffer latch input/output circuit 2000. The page buffer latch input/output circuit 2000 may receive control signals from the memory controller 1200 and perform a data latch use operation. The memory device 1100 may use the data latches of the page buffer circuit 1130 like the buffer memory 1300. Accordingly, the memory device 1100 may increase the utilization of data latches and effectively improve the storage capacity of the buffer memory 1300.

Figure 3:
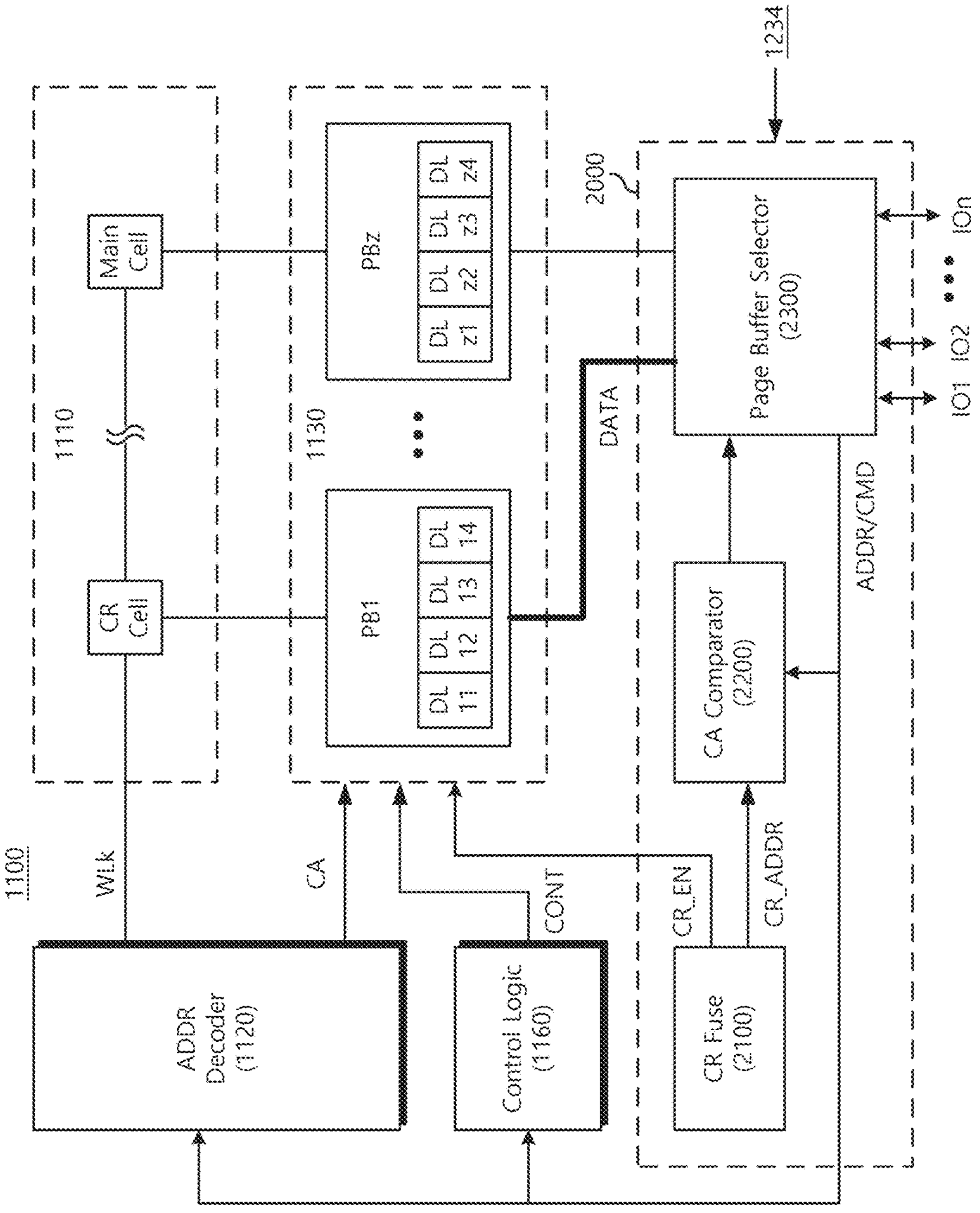
FIG. 3 is a block diagram illustrating an example of a page buffer latch input/output circuit.

FIG. 3 is a block diagram illustrating an example of a page buffer latch input/output circuit, e.g., the page buffer latch input/output circuit 2000 shown in FIG. 2. Referring to FIG. 3, the memory device 1100 may include a memory cell array 1110, an address decoder 1120, a page buffer circuit 1130, a control logic 1160, and a page buffer latch input/output circuit 2000.

The memory cell array 1110 may be connected to the address decoder 1120 through the k-th word line (WLk). A column repair cell (CR cell) and a main cell may be connected to the WLk. The main cell may be a memory cell for storing user data. The column repair cell may be a memory cell for storing data to be stored in the main cell when the main cell fails. The memory device 1100 may store data in the column repair cell without storing data in a failed cell through a column repair operation.

The page buffer circuit 1130 may include first to z-th page buffers (PB1 to PBz). For example, the first page buffer PB1 may be a column repair page buffer connected to the column repair cell (CR cell). The z-th page buffer (PBz) may be a main page buffer connected to the main cell.

The first to z-th page buffers (PB1 to PBz) may each include a plurality of data latches. The number of data latches in each page buffer may vary depending on the number of data bits stored, e.g., depending on whether the memory cell array includes single-level cells (SLC), multi-level cells (MLC), triple level cells (TLC), and/or quad-level cells (QLC).

For example, a page buffer connected to a TLC memory cell that stores 3 bits of data in one memory cell may include three or more data latches. A page buffer connected to a QLC memory cell that stores 4 bits of data in one memory cell may include four or more data latches. In the example of FIG. 3, the first page buffer PB1 may include $11^{th}$ to $14^{th}$ data latches DL11 to DL14. The z-th page buffer (PBz) may include z1-th to z4-th data latches (DLz1 to DLz4).

The data latch resource used as a substitute for a memory buffer or in addition to the memory buffer may vary depending on the configuration of the page buffer connected to the corresponding cell. For example, in the case of QLC, the number of data latches in the page buffer may range from 4 to 6 or more depending on the implementation. The number of data latches used as memory buffers may be set to some or all depending on the scope of use.

The page buffer latch input/output circuit 2000 may perform the data latch use operation in response to control signals from the page buffer latch control module 1234. The page buffer latch input/output circuit 2000 may use the data latches in the page buffers of the page buffer circuit 1130 like the buffer memory 1300 through the data latch use operation.

As an example, the page buffer latch input/output circuit 2000 may use the data latches of the column repair page buffer in the page buffer circuit 1130 like the buffer memory 1300. For example, the 11th to 14th data latches DL11 to DL14 of the first page buffer PB1 may be used instead of or in addition to the buffer memory 1300.

The page buffer latch input/output circuit 2000 may include a column repair fuse circuit 2100, a column address comparator 2200 (e.g., a circuit), and a page buffer selector 2300 (e.g., a circuit). The column repair fuse circuit 2100 and the column address comparator 2200 may be used in a general column repair operation, e.g., in addition to in the data latch use operation.

The column repair fuse circuit 2100 may store column repair address information. The column repair address information may include an address of a failed memory cell (e.g., main cell) and an address of a column repair cell (e.g., CR cell). The column repair fuse circuit 2100 may provide a column repair address (CR_ADDR) to the column address comparator 2200 during the column repair operation and/or the data latch use operation.

The column repair fuse circuit 2100 may generate a column repair enable signal (CR_EN) during the data latch use operation. The column repair fuse circuit 2100 may use the column repair enable signal CR_EN to prevent data stored in the data latches (e.g., DL11 to DL14) from being programmed to the column repair memory cell during the data latch use operation.

The column address comparator 2200 may compare the column repair address (CR_ADDR) provided from the column repair fuse circuit 2100 with the address (ADDR) provided from the input/output circuit 1140 (see FIG. 2). If they match, the column repair fuse circuit 2100 may provide a signal for selecting the column repair page buffer (e.g., PB1) to the page buffer selector 2300.

The page buffer selector 2300 may receive a control signal from the page buffer latch control module 1234 (see FIG. 1) and perform the data latch use operation. The page buffer selector 2300 may receive a column address comparison signal from the column address comparator 2200 and select the column repair page buffer (e.g., PB1) and/or the main page buffer (e.g., PBz).

For example, the page buffer selector 2300 may compare the input address (ADDR) with the column repair address (CR_ADDR) stored in the column repair fuse circuit 2100, and when they match, may select the column repair page buffer (for example, PB1). The page buffer selector 2300 may use the data latches DL11 to DL14 of the column repair page buffer (e.g., PB1) instead of the buffer memory 1300.

Figure 4:
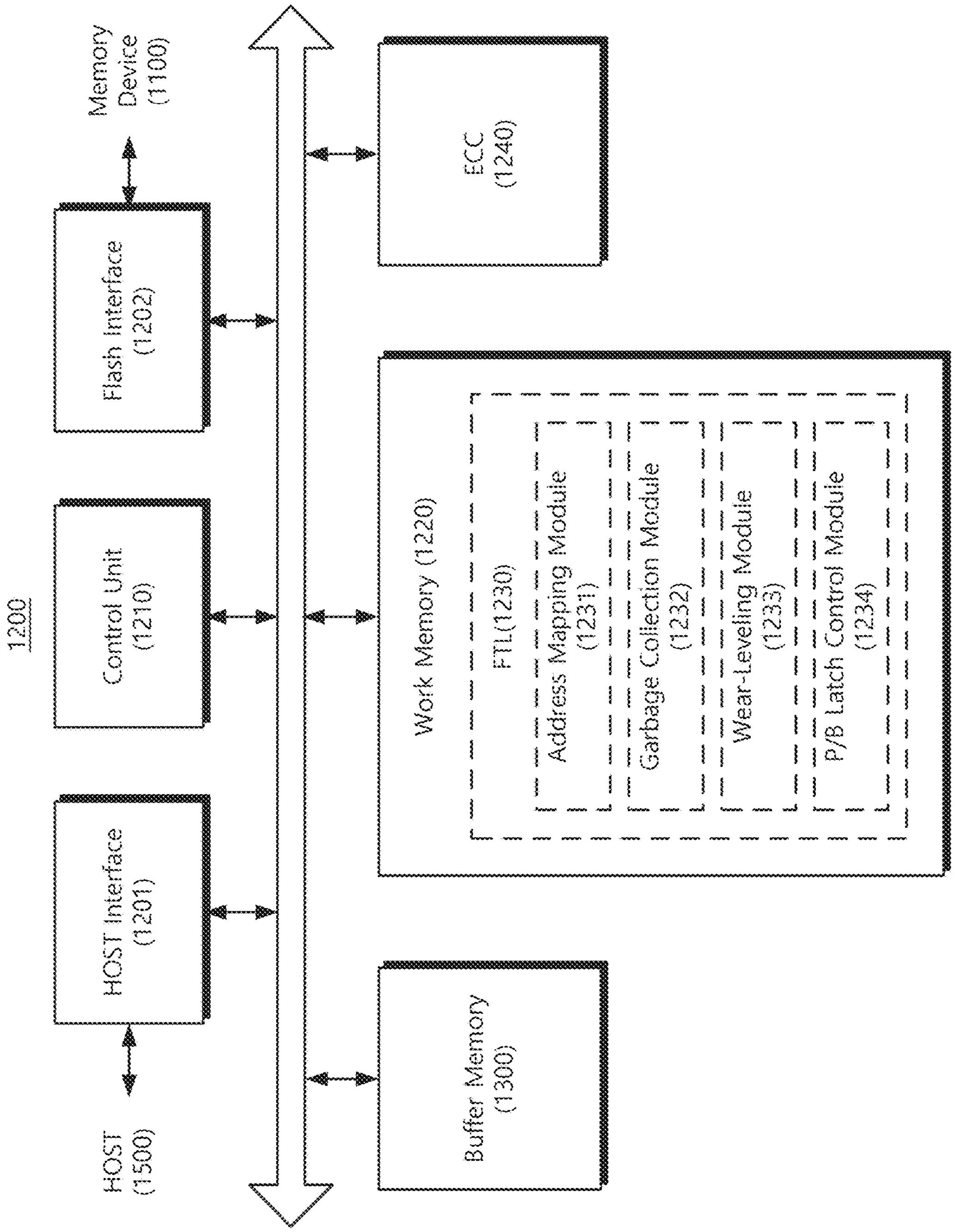
FIG. 4 is a block diagram illustrating example of a memory controller in FIG. 1.

FIG. 4 is a block diagram illustrating an example of a memory controller, e.g., the memory controller 1200 in FIG. 1. Referring to FIG. 4, the memory controller 1200 may include a host interface 1201, a flash interface 1202, a control unit 1210, a work memory 1220, and an error correction code (ECC) circuit 1240. The work memory 1220 may drive a flash translation layer (FTL) 1230.

The memory controller 1200 may further include various components. For example, the memory controller 1200 may include a buffer memory that temporarily stores data resulting from a read or write operation of the flash memory 1100. The memory controller 1200 may further include a buffer control module for controlling the buffer memory, a command generation module for generating a command (CMD) for controlling a memory operation according to a request from the host 1500, and/or other components.

The host interface 1201 may provide an interface between the host 1500 and the memory controller 1200. Standard interfaces may include various interface methods such as advanced technology attachment (ATA), serial ATA (SATA), external SATA (e-SATA), small computer small interface (SCSI), serial attached SCSI (SAS), peripheral component interconnection (PCI), PCI express (PCI-E), IEEE 1394, universal serial bus (USB), secure digital card (SD), multi-media card (MMC), embedded multi-media card (eMMC), universal flash storage (UFS), compact flash (CF), etc.

The flash interface 1202 may provide an interface between the flash memory 1100 and the memory controller 1200. For example, write or read data may be transmitted to and received from the flash memory 1100 through the flash interface 1202. The flash interface 1202 may provide commands and addresses to the flash memory 1100. The flash interface 1202 may provide data read from the flash memory 1100 to the memory controller 1200.

The control unit 1210 may include a central processing unit or microprocessor, and may control the overall operation of the memory controller 1200. The control unit 1210 may drive firmware loaded in the work memory 1220 to control the memory controller 1200.

The work memory 1220 may be implemented with various types of memory, such as DRAM, SRAM, or PRAM. The work memory 1220 may drive the flash translation layer (FTL) 1230 under the control of the control unit 1210.

The flash translation layer 1230 may be loaded from flash memory to the work memory 1220 during a boot operation of the storage device. The flash translation layer 1230 may include an address mapping module 1231, a garbage collection module 1232, and a wear-leveling module 1233, depending on the function implemented by firmware.

The address mapping module 1231 may perform address mapping operations on a page-by-page or block-by-block basis. The page address mapping operation is an operation that converts a logical page address received from the file system into a physical page address in the flash memory 1100. For this purpose, a page-level address mapping table may be maintained in the work memory 1220. The page address mapping operation may provide excellent garbage collection performance, but may use a large address mapping table.

The block address mapping operation is an operation that converts a logical block address received from the file system into a physical block address in the flash memory 1100. Pages belonging to the same logical block may belong to the same physical block. For this purpose, the block address mapping operation may maintain a block-level address mapping table in the work memory 1220. Block address mapping operations may use a small address mapping table, but additional garbage collection operations may be performed.

The flash translation layer 1230 may perform a hybrid mapping operation that combines the advantages of a page address mapping operation and a block address mapping operation. The flash translation layer 1230 may perform a hybrid mapping operation based on the log buffer. The log buffer-based hybrid mapping operation uses a small memory space while providing excellent garbage collection performance.

The garbage collection module 1232 may perform a garbage collection operation by referring to the address mapping table. The garbage collection module 1232 may use an address mapping table to secure one or more free blocks. The garbage collection module 1232 may move one or more valid data stored in a source block to a target block using the address mapping table. The garbage collection module 1232 may make a free block by erasing the source block from which all valid data has been moved.

The wear-leveling module 1233 may manage the wear-level of memory cells of the memory device (e.g., flash memory) 1100. Memory cells may be deteriorated by write and erase operations, etc. Deteriorated memory cells may cause defects. The wear-leveling module 1233 may prevent specific cell areas from wearing out faster than other cell areas by managing program-erase cycles for the memory cell array. The wear-leveling module 1233 may control the address mapping module 1231 so that program and erase times are equally assigned to cell areas of the memory cell array.

The page buffer latch control module 1234 may control the data latch use operation of the page buffer latch input/output circuit 2000. The page buffer latch control module 1234 may use the data latches of the page buffer circuit 1130 like the buffer memory 1300 through the data latch use operation. By using the data latches of the page buffer circuit 1130 like the buffer memory 1300, the effective buffer memory available to the memory controller 1200 may be increased.

The ECC circuit 1240 may generate an error correction code (ECC) to correct fail bits or error bits of data received from the flash memory 1100. The ECC circuit 1240 may perform error correction encoding on data provided to the flash memory 1100 to form data to which a parity bit is added. Parity bits may be stored in flash memory 1100.

The ECC circuit 1240 may perform error correction decoding on data output from the flash memory 1100. The ECC circuit 1240 may correct errors using parity. The ECC circuit 1240 may correct errors using coded modulation, such as low density parity check (LDPC) code, Bose-Chaudhuri-Hocquenghem (BCH) code, turbo code, Reed-Solomon code, convolution code, recursive systematic code (RSC), trellis-coded modulation (TCM), and block coded modulation (BCM).

The ECC circuit 1240 may have an error correction allowable range. For example, the ECC circuit 1240 may correct errors of up to 40 bits for 2K bytes of page data. In this case, the maximum allowable range in which the ECC circuit 1240 may correct errors is 40 bits. For example, the ECC circuit 1240 may not correct errors in the page if errors in more than 40 bits occur. A page whose errors may not be corrected like this is called a defective page. A memory cell in which an error occurs in a defective page is called a defective cell.

Figure 5:
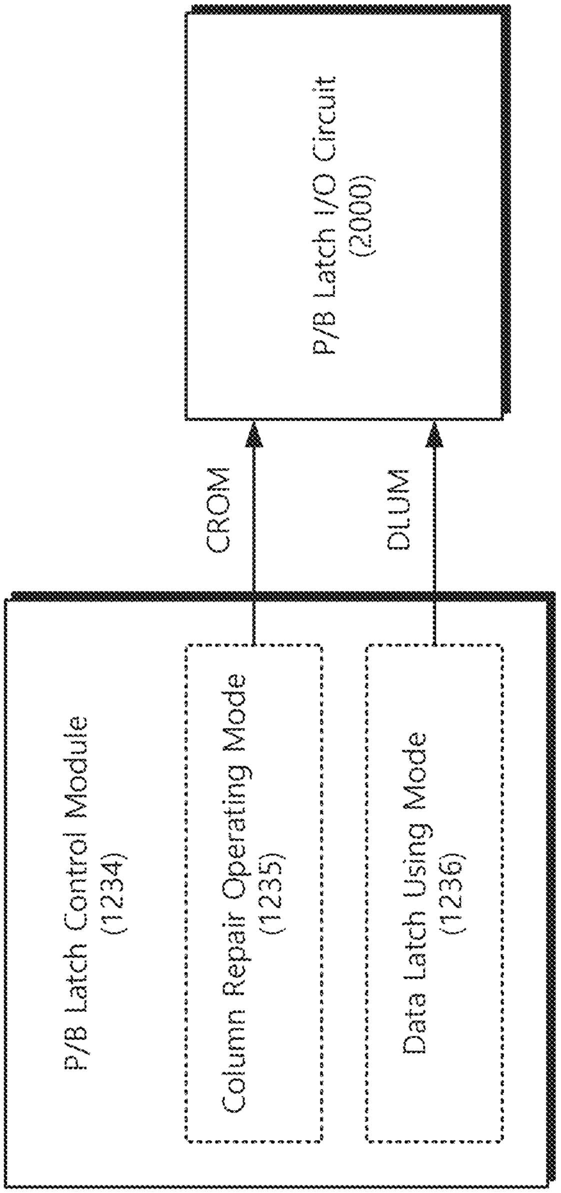
FIG. 5 is a block diagram illustrating an example of an operation mode of a page buffer latch control module.

FIG. 5 is a block diagram illustrating an example of an operation mode of a page buffer latch control module, e.g., the page buffer latch control module 1234 shown in FIG. 4. Referring to FIG. 5, the page buffer latch control module 1234 may perform a column repair operation mode or a data latch use mode.

The page buffer latch control module 1234 may include a column repair operation mode unit 1235 and a data latch use mode unit 1236. The column repair operation mode unit 1235 may provide a column repair operation mode signal (CROM) to the page buffer latch input/output circuit 2000 to perform the column repair operation. The data latch use mode unit 1236 may provide a data latch use mode signal (DLUM) to the page buffer latch input/output circuit 2000 to perform the data latch use operation.

Figure 6:
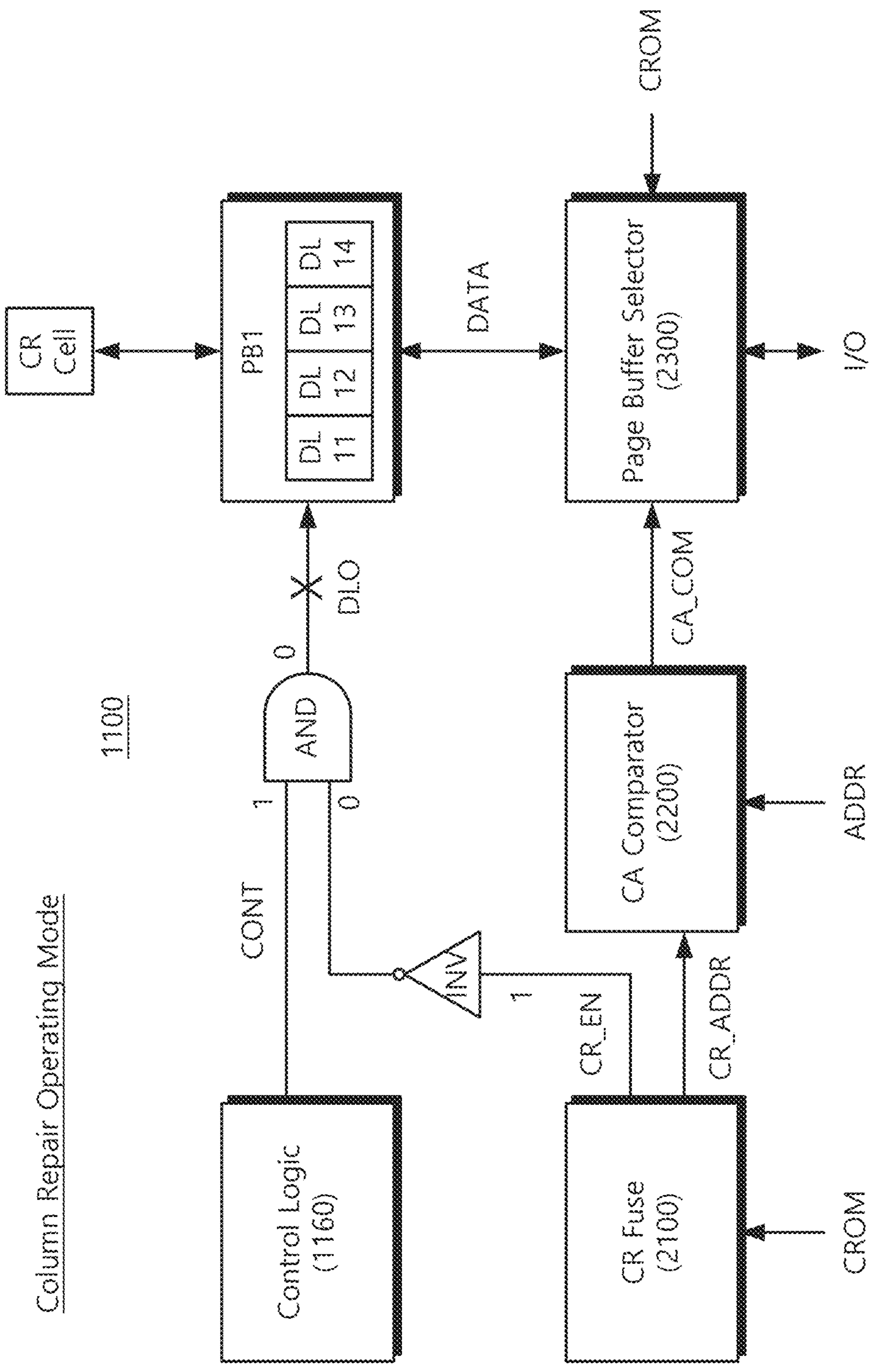
FIG. 6 is a block diagram illustrating an example of a column repair operation mode of a page buffer latch control module.

FIG. 6 is a block diagram illustrating an example of the column repair operation mode of the page buffer latch control module shown in FIG. 5. Referring to FIG. 6, the page buffer latch control module 1234 (see FIG. 5) may provide a column repair operation mode signal (CROM) to the memory device 1100 to perform the column repair operation when the main cell fails.

The column repair fuse circuit 2100 may receive the column repair operation mode signal (CROM) and activate the column repair enable signal (CR_EN). The column repair enable signal (CR_EN) may be a signal for performing the column repair operation. The column repair enable signal (CR_EN) may be provided to the AND gate (AND) through the inverter (INV). The AND gate may receive a control signal (CONT) from the control logic 1160 and an inverted column repair enable signal to deactivate the data latch output signal (DLO).

For example, if the column repair enable signal CR_EN is 1, the inverter (INV) may output an inverted column repair enable signal. The inverted column repair enable signal may be 0. The AND gate (AND) may receive the control signal (CONT) 1 and the inverted column repair enable signal 0 to output the data latch output signal (DLO) 0.

The page buffer selector 2300 may receive the column repair operation mode signal (CROM) from the memory controller 1200 to perform the column repair operation. The page buffer selector 2300 may receive a column address comparison signal (CA_COM) from the column address comparator 2200 and provide data (DATA) to the first page buffer (PB1). Here, the first page buffer PB1 may be a column repair page buffer.

During a program operation, the memory device 1100 may program data stored in the data latches DL11 to DL14 of the first page buffer PB1 into the column repair cell (CR Cell). Alternatively, the memory device 1100 may store data programmed in the column repair cell (CR Cell) in the data latches DL11 to DL14 of the first page buffer PB1 during a read operation.

Figure 7:
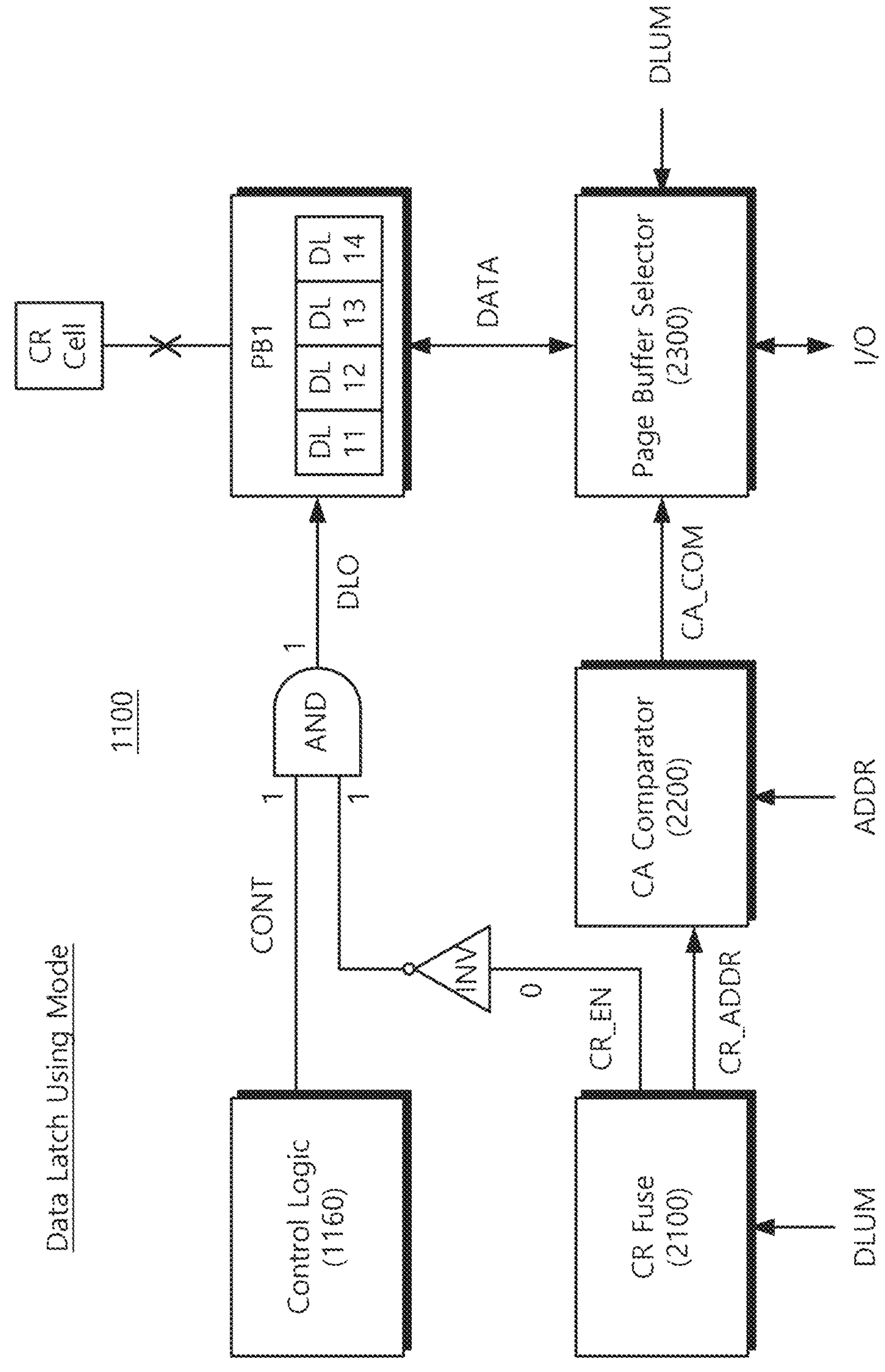
FIG. 7 is a block diagram illustrating an example of a data latch use mode of a page buffer latch control module.

FIG. 7 is a block diagram illustrating an example of the data latch use mode of a page buffer latch control module, e.g., the page buffer latch control module 1234 shown in FIG. 5. Referring to FIG. 7, the page buffer latch control module 1234 (see FIG. 5) may perform a data latch use operation regardless of a column repair operation. The page buffer latch control module 1234 may provide a data latch use mode signal (DLUM) to the memory device 1100 to perform a data latch use operation.

The column repair fuse circuit 2100 may receive a data latch use mode signal (DLUM) and deactivate the column repair enable signal (CR_EN). For example, the column repair enable signal (CR_EN) may be 0. The column repair enable signal (CR_EN) may be provided to the AND gate (AND) through the inverter (INV). The AND gate may receive the control signal (CONT) 1 and the inverted column repair enable signal 1 to activate the data latch output signal (DLO). The data latch output signal (DLO) may be 1.

The page buffer selector 2300 may receive a data latch use mode signal (DLUM) from the memory controller 1200 and perform a data latch use operation. The page buffer selector 2300 may receive a column address comparison signal (CA_COM) from the column address comparator 2200 and provide data (DATA) to the first page buffer (PB1). The first page buffer PB1 may be a column repair page buffer.

The memory device 1100 may use the data latches DL11 to DL14 of the first page buffer PB1 instead of or in addition to the buffer memory 1300 (e.g., as if it were the buffer memory 1300), to perform a program operation and/or a read operation. The memory device 1100 may store data to be stored in the buffer memory 1300 in data latches of the column repair page buffer.

Since, in conventional operation, the column repair page buffer may be used only when the main cell fails, it may not be used when there is no failure. The storage device 1000 (see FIG. 1) according to some implementations may secure additional data storage space by using the data latches of the column repair page buffer, which are otherwise used only during a column repair operation, as if the data latches were the buffer memory 1300.

Figure 8:
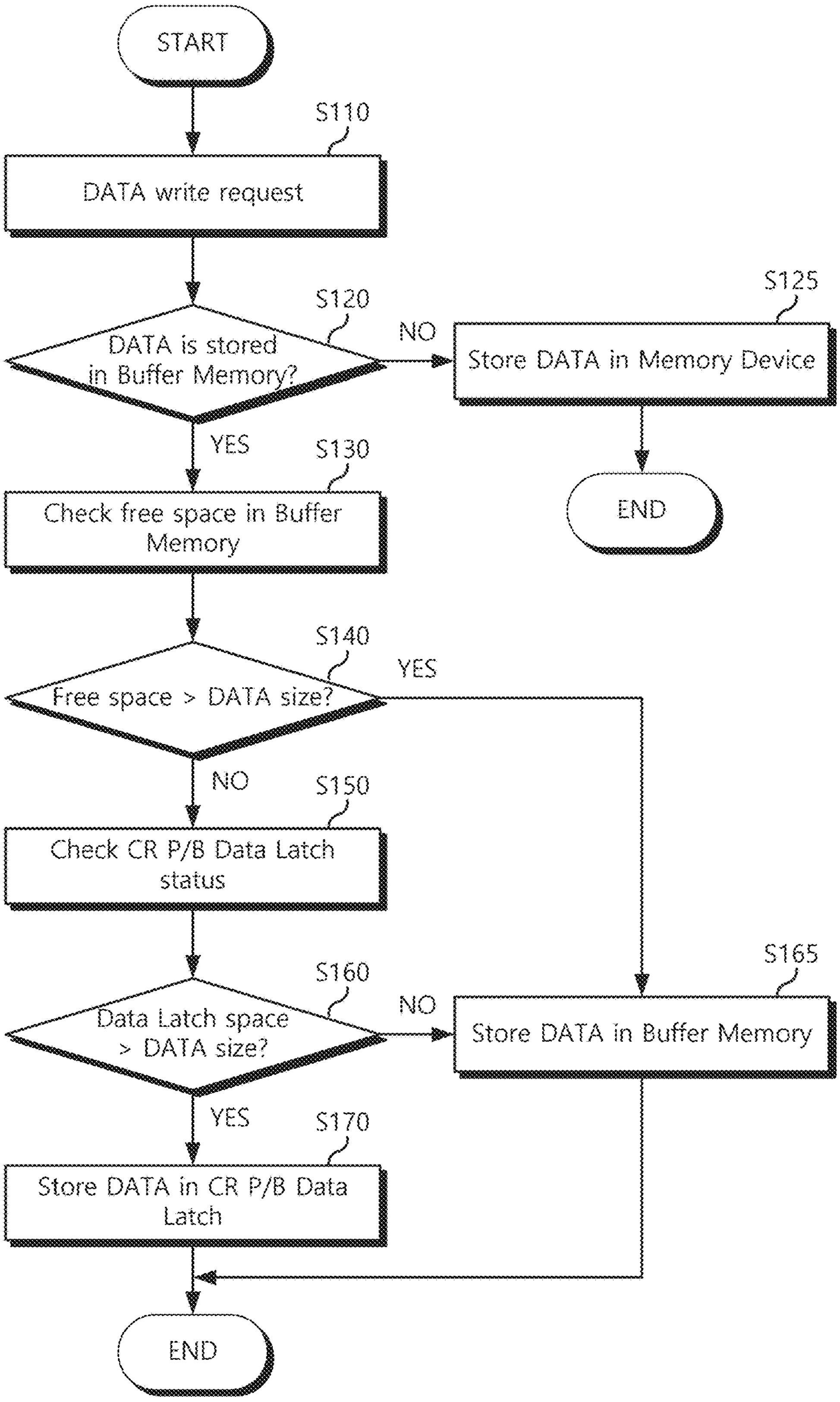
FIG. 8 is a flowchart illustrating an example of an operation method of a page buffer latch control module.

FIG. 8 is a flowchart illustrating an example of the operation method of a page buffer latch control module, e.g., the page buffer latch control module 1234 of FIG. 5. The page buffer latch control module 1234 may control the data latch use operation of the memory device 1100. The memory controller 1200 may receive a data write request from a host and provide a data latch use mode signal (DLUM) to the memory device 1100. The memory device 1100 may receive a data latch use mode signal (DLUM) and perform a data latch use operation.

In operation S110, the page buffer latch control module 1234 may receive a data write request from the host. Here, the data may be data that is frequently used repeatedly (for example, hot data) or special-purpose data (for example, parameters or metadata) for managing the memory device 1100. The page buffer latch control module 1234 may determine whether the data requested to be written by the host is special-purpose data, and may perform the next operation if it is a predetermined special-purpose data.

For example, the page buffer latch control module 1234 may repeatedly write and/or read data at the same address N or more times during a predetermined time. At this time, the page buffer latch control module 1234 may determine these data to be special-purpose data (e.g., hot data) and perform a data latch use operation.

In operation S120, the page buffer latch control module 1234 may determine whether the data is to be stored in the buffer memory 1300. If the page buffer latch control module 1234 determines that the data is not to be stored in the buffer memory 1300 (NO), operation S125 may be performed. In operation S125, the page buffer latch control module 1234 may store the data in the memory cell array 1110 of the memory device 1100 (e.g., flash memory). If the page buffer latch control module 1234 determines that data is to be stored in the buffer memory 1300 (YES), operation S130 may be performed.

In operation S130, the page buffer latch control module 1234 may check the free space of the buffer memory 1300. When receiving a write request from the host, the page buffer latch control module 1234 may check the total storage space, the currently used storage space, and/or the unused storage space, of the buffer memory 1300. The page buffer latch control module 1234 may calculate the free space of the buffer memory 1300 according to a predetermined algorithm.

In operation S140, the page buffer latch control module 1234 may determine whether the free space of the buffer memory 1300 calculated in operation S130 is larger than the size of data requested to be written by the host. If the free space is larger than the data size (YES), the page buffer latch control module 1234 may control the data to be stored in the buffer memory 1300 (S165). The page buffer latch control module 1234 may perform operation S150 if the free space of the buffer memory 1300 is less than or equal to the data size (NO).

In operation S150, the page buffer latch control module 1234 may check the data latch status of the column repair page buffer (CR P/B). The column repair page buffer (CR P/B) may include a plurality of page buffers. The plurality of page buffers may be divided into page buffers that perform a column repair operation and page buffers that do not perform a column repair operation.

Data to be stored in main cells may be stored in memory cells connected to page buffers that perform a column repair operation. Data may not be stored in memory cells connected to page buffers on which a column repair operation has not been performed. As an example, the page buffer latch control module 1234 may check the data latch status of page buffers for which a column repair operation has not been performed.

In operation S160, the page buffer latch control module 1234 may determine whether the data latch space is larger than the data size. If the data latch space is smaller than or equal to the data size (NO), the page buffer latch control module 1234 may control the data to be stored in an unused storage space of the buffer memory 1300 (S165). If the data latch space is larger than the data size (YES), the page buffer latch control module 1234 may perform operation S170.

In operation S170, the page buffer latch control module 1234 may control data to be stored in the data latch of the column repair page buffer (CR P/B). As previously described, column repair page buffers (CR P/B) may be page buffers on which a column repair operation has not been performed. Each page buffer may include a plurality of data latches. For example, one page buffer may include four data latches.

The page buffer latch control module 1234 may store data in data latches of the column repair page buffer (CR P/B) in predetermined units. For example, the page buffer latch control module 1234 may store data in I/O units. The I/O unit of the memory device 1100 may be 8 bits or 16 bits.

Figure 9:
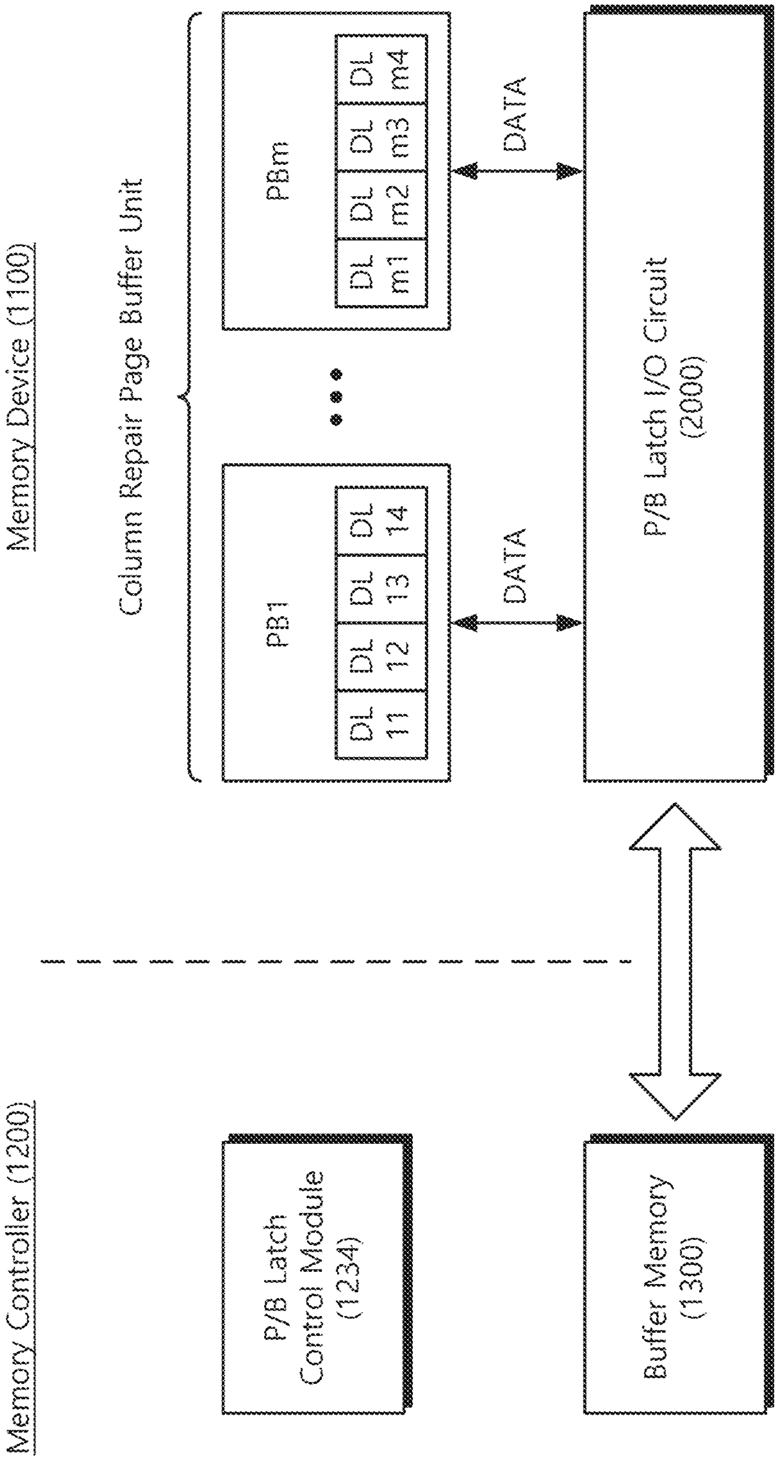
FIG. 9 is a block diagram illustrating an example of a column repair page buffer unit of a page buffer latch control module.

FIG. 9 is a block diagram illustrating a column repair page buffer unit of a memory device, e.g., memory device 1100. The data latch use operation of the page buffer latch control module 1234 may be performed using the column repair page buffer unit. For example, a data latch use operation may be performed in 8-bit or 16-bit units.

Referring to FIG. 9, the column repair page buffer unit may be the first to m-th page buffers (PB1 to PBm). The first page buffer (PB1) may include 11th to 14th data latches (DL11 to DL14). And the m-th page The buffer (PBm) may include m1-th to m4-th data latches (DLm1 to DLm4).

When the data latch use operation is performed in units of 8 bits, data may be simultaneously stored in the data latches of the first and second page buffers PB1 and PB2. When the data latch use operation is performed in units of 16 bits, data may be simultaneously stored in the data latches of the first to fourth page buffers (PB1 to PB4).

The page buffer latch control module 1234 may control the data latch use operation of the page buffer latch input/output circuit 2000 on a column repair page buffer unit basis. The page buffer latch control module 1234 may use the data latches of the page buffer circuit 1130 as if it were the buffer memory 1300 through a data latch use operation. By using the data latches of the page buffer circuit 1130 like the buffer memory 1300, the usability of the buffer memory 1300 may be increased.

Figure 10:
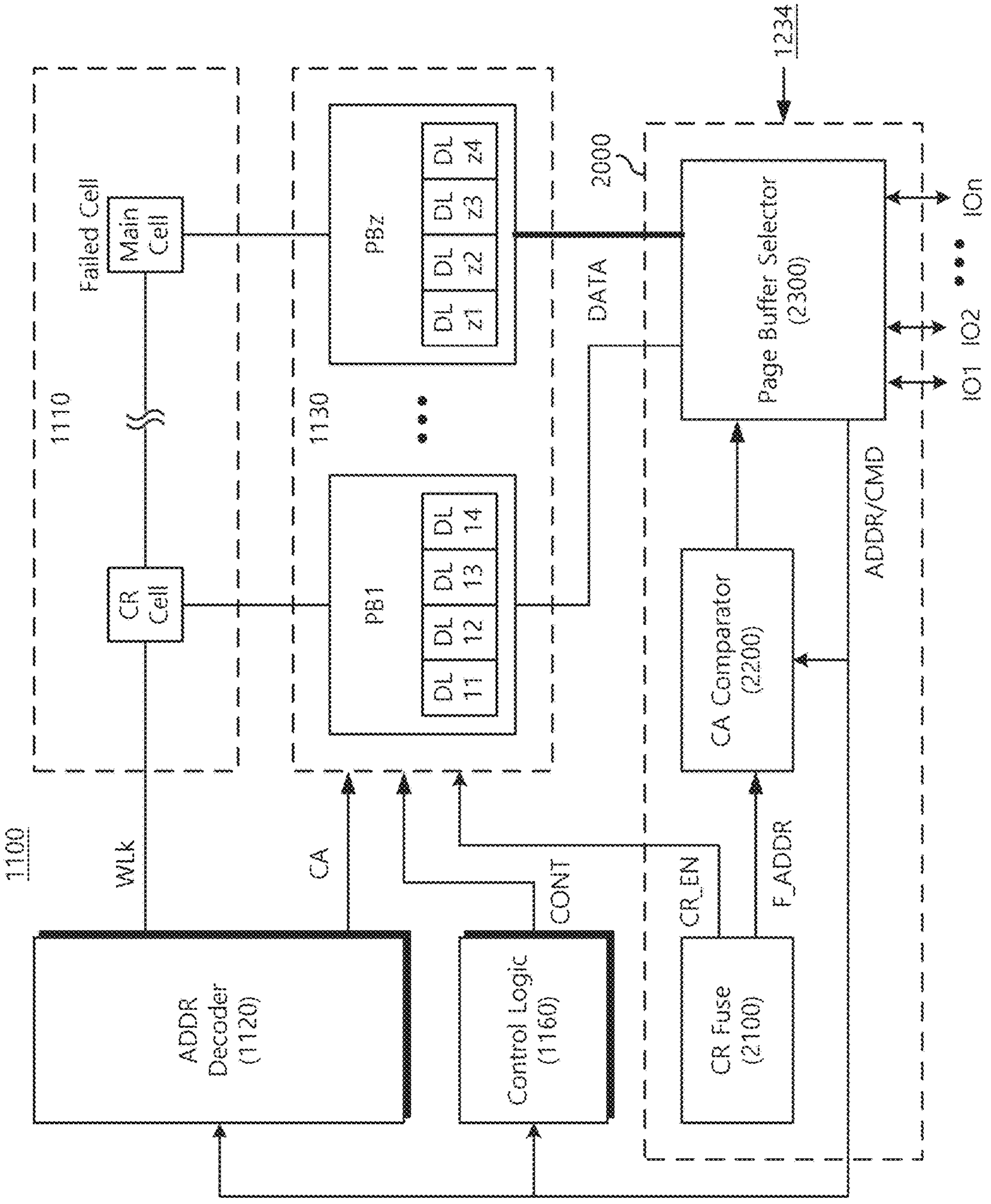
FIG. 10 is a block diagram illustrating an example of a page buffer latch input/output circuit.

FIG. 10 is a block diagram illustrating an example of a page buffer latch input/output circuit, e.g., the page buffer latch input/output circuit shown in FIG. 3. Referring to FIG. 10, the memory device 1100 may include a memory cell array 1110, an address decoder 1120, a page buffer circuit 1130, a control logic 1160, and a page buffer latch input/output circuit 2000.

The memory device 1100 may store data in a column repair cell (CR cell) without storing data in a failed cell through a column repair operation. The memory device 1100 may not use a page buffer connected to the failed cell. Hereinafter, the page buffer connected to the failed cell will be referred to as a failed page buffer. The memory device 1100 may use the data latches of the failed page buffer as a substitute for the buffer memory 1300 (or in addition to the buffer memory 1300) through the page buffer latch input/output circuit 2000.

The page buffer circuit 1130 may include first to z-th page buffers (PB1 to PBz). The first page buffer PB1 may be a column repair page buffer connected to a column repair cell (CR cell). The z-th page buffer (PBz) may be a page buffer connected to a failed main cell.

The page buffer latch input/output circuit 2000 may use the data latches of the failed page buffer (e.g., PBz) of the page buffer circuit 1130 like the buffer memory 1300 through a data latch use operation. For example, the z1-th to z4-th data latches (DLz1 to DLz4) of the z-th page buffer (PBz) may be used instead of, or in addition to, the buffer memory 1300.

The page buffer latch input/output circuit 2000 may include a column repair fuse circuit 2100, a column address comparator 2200, and a page buffer selector 2300. Here, the column repair fuse circuit 2100 and the column address comparator 2200 may be used in a general column repair operation in addition to a data latch use operation.

The column repair fuse circuit 2100 may store column repair address information. The column repair address information may include the address (F_ADDR) of the failed cell (Main Cell) and the column repair address (CR_ADDR). The column repair fuse circuit 2100 may provide the failed cell address (F_ADDR) to the column address comparator 2200 during a data latch use operation.

The column repair fuse circuit 2100 may generate a column repair enable signal (CR_EN) during the data latch use operation. The column repair fuse circuit 2100 may use the column repair enable signal CR_EN to prevent data stored in the data latches (e.g., DLz1 to DLz4) from being programmed to the failed cell (Main Cell) during the data latch use operation.

The column address comparator 2200 may compare the failed cell address (F_ADDR) provided from the column repair fuse circuit 2100 with the address (ADDR) provided from the input/output circuit 1140 (see FIG. 2). If they match, the column repair fuse circuit 2100 may provide a signal for selecting the failed page buffer (e.g., PBz) to the page buffer selector 2300.

The page buffer selector 2300 may receive a column address comparison signal from the column address comparator 2200 and select a failed page buffer (e.g., PBz). The page buffer selector 2300 may store data in the data latches (DLz1 to DL1*z*) of the failed page buffer (e.g., PBz). The page buffer latch input/output circuit 2000 may use the data latches of the failed page buffer (e.g., PBz) like the buffer memory 1300.

Figure 11:
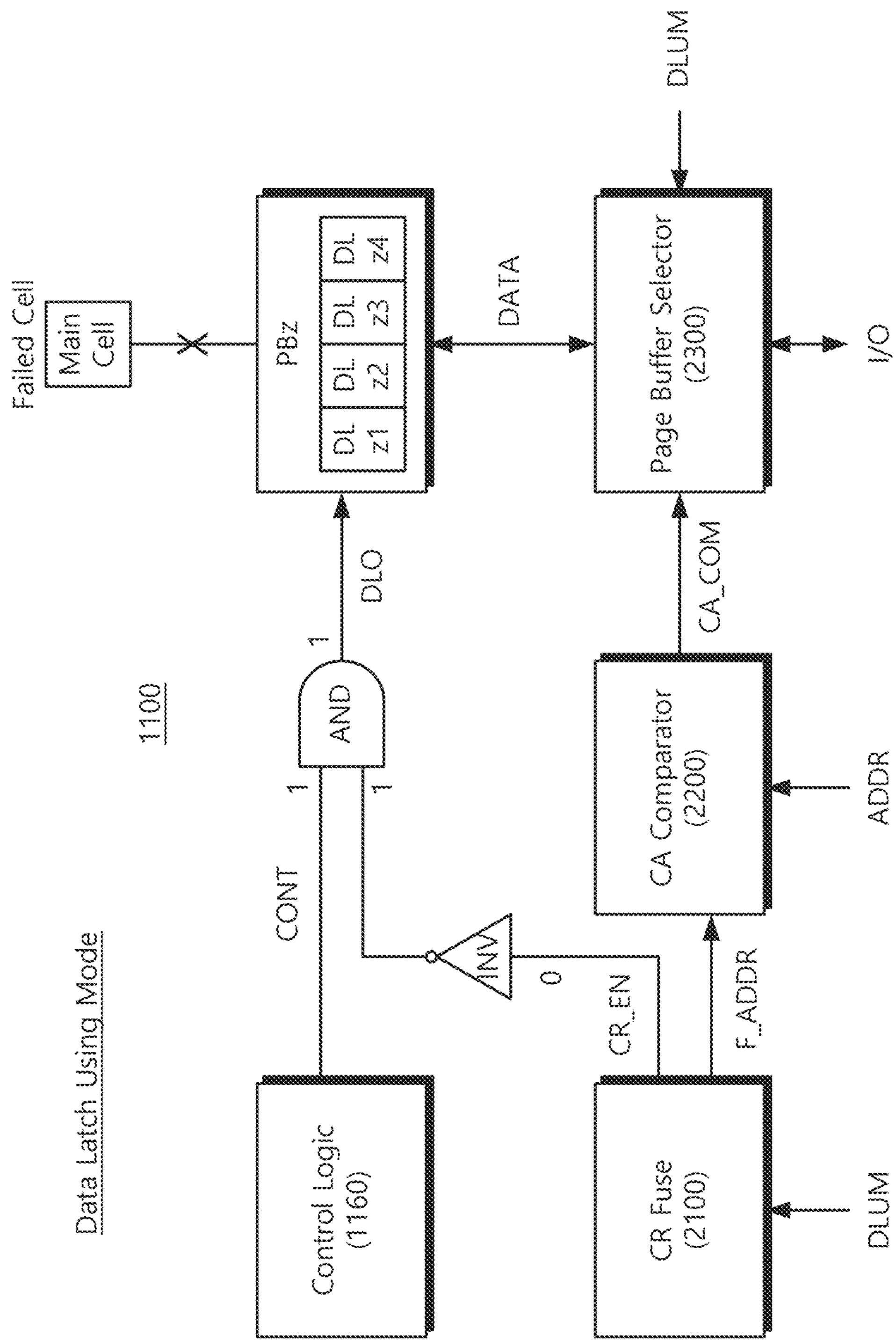
FIG. 11 is a block diagram illustrating an example of a data latch use mode of a page buffer latch control module.

FIG. 11 is a block diagram illustrating an example of a data latch use mode of a page buffer latch control module, e.g., the page buffer latch control module shown in FIG. 5. Referring to FIG. 11, the page buffer latch control module 1234 (see FIG. 5) may perform a data latch use operation regardless of the column repair operation. The page buffer latch control module 1234 may provide a data latch use mode signal (DLUM) to the memory device 1100 to perform a data latch use operation.

The column repair fuse circuit 2100 may receive a data latch use mode signal (DLUM) and generate a column repair enable signal (CR_EN) 0. The column repair enable signal (CR_EN) may be provided to the AND gate (AND) through the inverter (INV). The AND gate may receive the control signal (CONT) 1 from the control logic 1160 and the inverted column repair enable signal 1 from the inverter (INV), and activate the data latch output signal (DLO).

The page buffer selector 2300 may receive a data latch use mode signal (DLUM) from the memory controller 1200 and perform a data latch use operation. The page buffer selector 2300 may receive a column address comparison signal (CA_COM) from the column address comparator 2200 and provide data to the z-th page buffer (PBz). Here, the z-th page buffer (PBz) may be a failed page buffer.

The memory device 1100 may use the data latches DLz1 to DLz4 of the z-th page buffer PBz as if it were the buffer memory 1300, e.g., to perform a program operation and/or a read operation. The memory device 1100 may store data to be stored in the buffer memory 1300 in data latches of the failed page buffer.

The failed page buffer may not be used for conventional use because data is not stored in failed cells. Accordingly, the memory device 1100 may use the data latches of a failed page buffer as a substitute for the buffer memory 1300 through the page buffer latch input/output circuit 2000. Accordingly, the storage device 1000 (see FIG. 1) according to some implementations may secure additional data storage space by using the data latches of the unused failed page buffer as a substitute for the buffer memory 1300.

Figure 12:
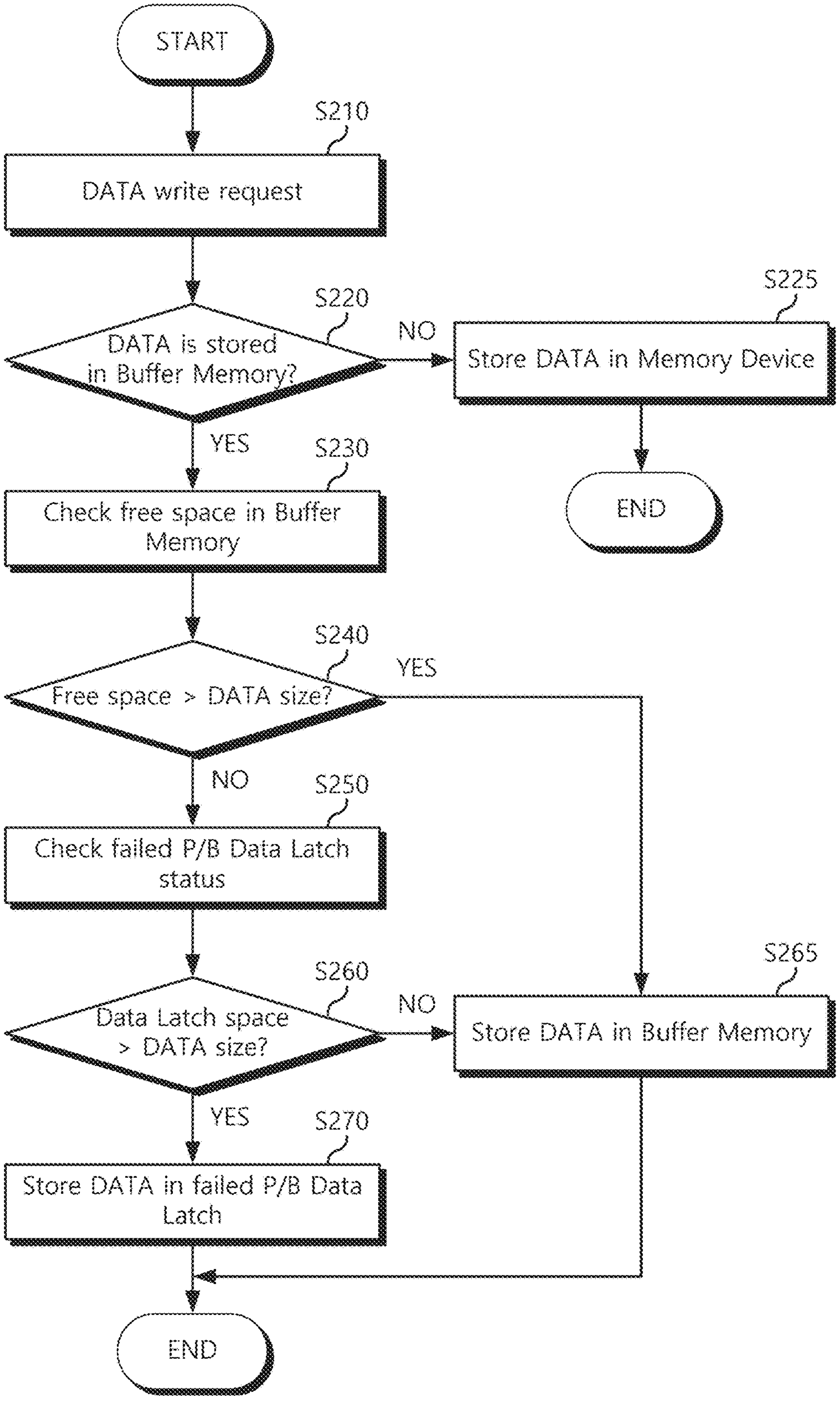
FIG. 12 is a flowchart explaining an example of an operation method of a page buffer latch control module that controls the data latch use operation of a memory device.

FIG. 12 is a flowchart explaining the operation method of a page buffer latch control module that controls the data latch use operation of a memory device, such as the memory device shown in FIG. 11. The memory controller 1200 may receive a data write request from the host and provide a data latch use mode signal (DLUM) to the memory device 1100. The memory device 1100 may receive a data latch use mode signal (DLUM) and perform a data latch use operation.

In operation S210, the page buffer latch control module 1234 may receive a data write request from the host. Here, the data may be special-purpose data, such as data that is frequently used repeatedly (e.g., hot data). The page buffer latch control module 1234 may determine whether the data requested to be written by the host is special-purpose data, and may perform the next operation if it is a predetermined special-purpose data.

In operation S220, the page buffer latch control module 1234 may determine whether the data is to be stored in the buffer memory 1300. If the page buffer latch control module 1234 determines that the data is not to be stored in the buffer memory 1300 (NO), the page buffer latch control module 1234 may store the data in the memory cell array 1110 of the memory device 1100 (S225). If the page buffer latch control module 1234 determines that data is to be stored in the buffer memory 1300 (YES), operation S230 may be performed.

In operation S230, the page buffer latch control module 1234 may check the free space of the buffer memory 1300. When the page buffer latch control module 1234 receives a write request from the host, it may check the total storage space, the currently used storage space, and the unused storage space of the buffer memory 1300. The page buffer latch control module 1234 may calculate the free space of the buffer memory 1300 according to a predetermined algorithm.

In operation S240, the page buffer latch control module 1234 may determine whether the free space of the buffer memory 1300 calculated in operation S230 is larger than the size of data requested to be written by the host. If the free space is larger than the data size (YES), the page buffer latch control module 1234 may control the data to be stored in the buffer memory 1300 (S265). If the free space of the buffer memory 1300 is less than or equal to the data size (NO), the page buffer latch control module 1234 may perform operation S250.

In operation S250, the page buffer latch control module 1234 may check the data latch status of the failed page buffer. The failed page buffer may include a plurality of page buffers. The page buffer latch control module 1234 may check the data latch status of each of the plurality of page buffers.

In operation S260, the page buffer latch control module 1234 may determine whether the data latch space is larger than the data size. If the data latch space is smaller than or equal to the data size (NO), the page buffer latch control module 1234 may control the data to be stored in an unused storage space of the buffer memory 1300 (S265). If the data latch space is larger than the data size (YES), the page buffer latch control module 1234 may perform operation S270.

In operation S270, the page buffer latch control module 1234 may control data to be stored in the data latches of the failed page buffer (failed P/B). Each page buffer may include a plurality of data latches. For example, one page buffer may include four data latches. The page buffer latch control module 1234 may store data in data latches of the failed page buffer in predetermined units.

Figure 13:
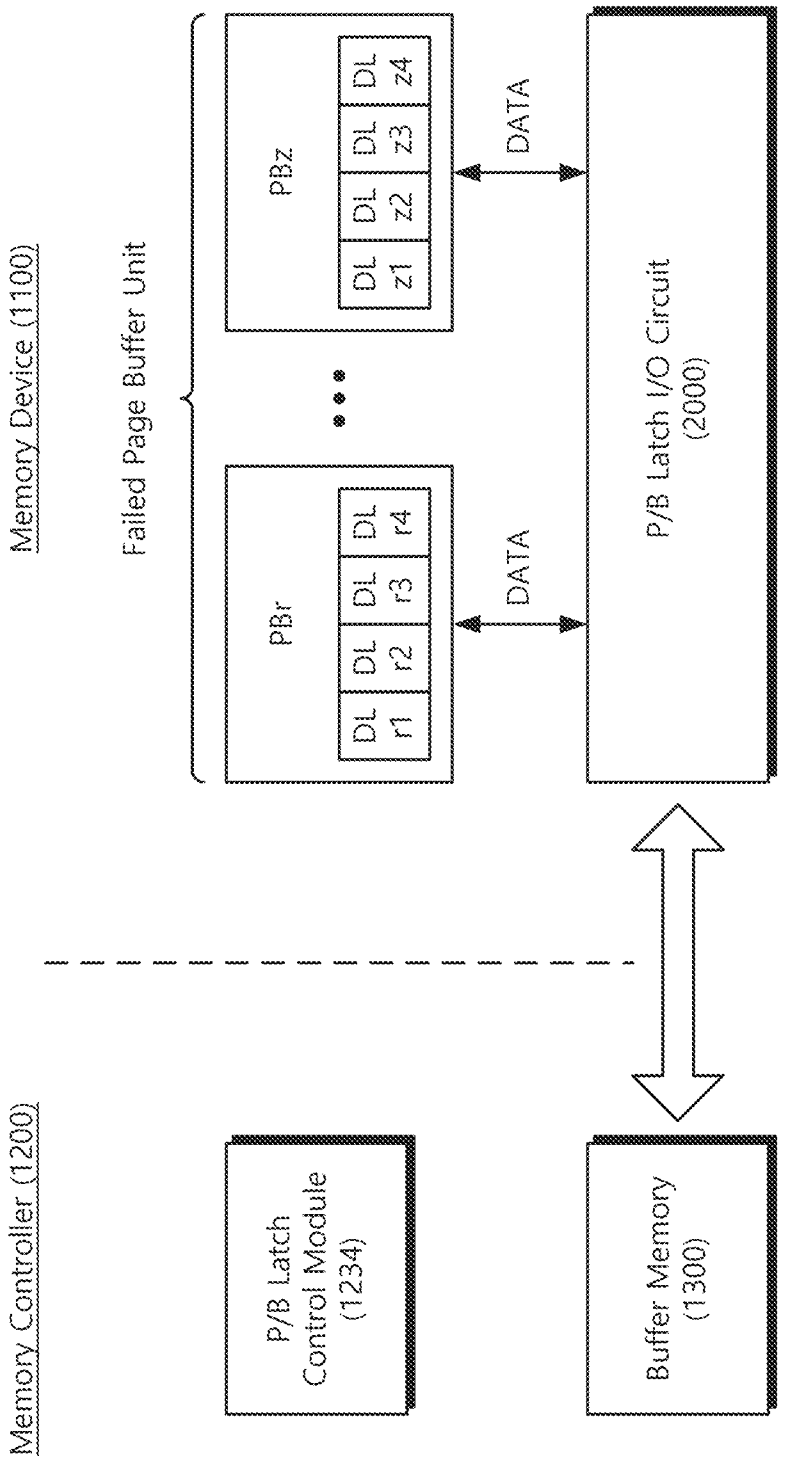
FIG. 13 is a block diagram illustrating an example of a failed page buffer unit of a page buffer latch control module.

FIG. 13 is a block diagram illustrating an example of a failed page buffer unit of a memory device, such as the memory device 1100. The data latch use operation of the page buffer latch control module 1234 may be performed with a failed page buffer unit. For example, a data latch use operation may be performed in 8-bit or 16-bit units.

Referring to FIG. 13, the failed page buffer unit may be the r-th to z-th page buffers (PBr to PBz). The r-th page buffer PBr may include r1-th to r4-th data latches (DLr1 to DLr4). And the z-th page buffer PBz may include z1-th to z4-th data latches (DLz1 to DLz4).

When the data latch use operation is performed in units of 8 bits, data may be simultaneously stored in the data latches of the r-th and r+1-th page buffers (PBr, PBr+1). When the data latch use operation is performed in units of 16 bits, data may be simultaneously stored in the data latches of the r-th to r+3-th page buffers (PBr to PBr+3).

The page buffer latch control module 1234 may control the data latch use operation of the page buffer latch input/output circuit 2000 on a failed page buffer unit basis. The page buffer latch control module 1234 may use the data latches of the page buffer circuit 1130 like the buffer memory 1300 through a data latch use operation. By using the data latches of the page buffer circuit 1130 like the buffer memory 1300, the usability of the buffer memory 1300 may be increased.

Figure 14:
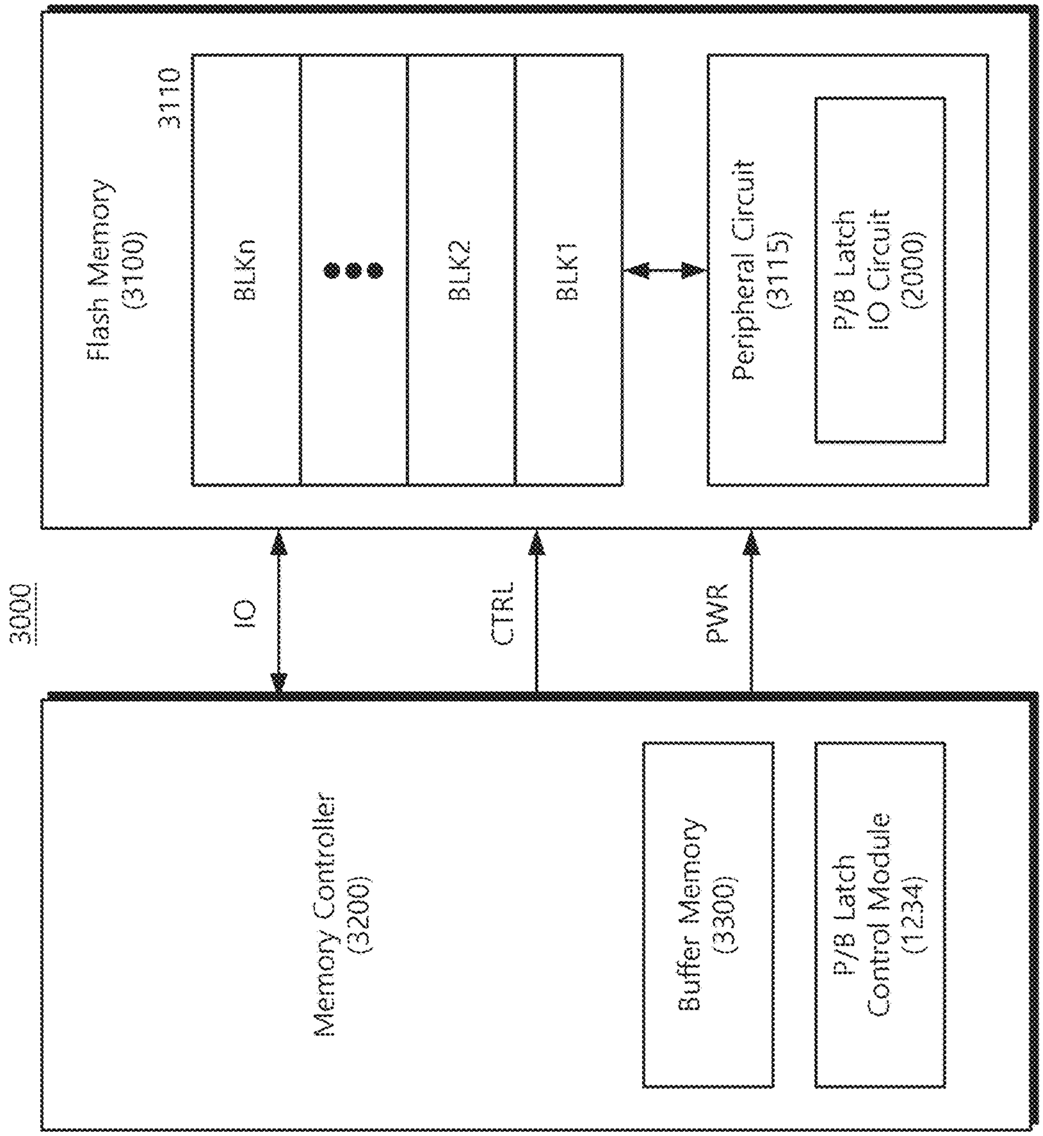
FIG. 14 is a block diagram illustrating an example of a data latch use operation of a storage device including a flash memory.

FIG. 14 is a block diagram illustrating a data latch use operation of a storage device including a flash memory according to some implementations of the present disclosure. Referring to FIG. 14, the storage device 3000 may include a flash memory 3100 and a memory controller 3200.

The flash memory 3100 may include a memory cell array 3110 and a peripheral circuit 3115. The memory cell array 3110 may include a plurality of memory blocks BLK1 to BLKn. The peripheral circuit 3115 may receive external power (PWR) through power lines and generate various levels of internal powers. The peripheral circuit 3115 may include a page buffer latch input/output circuit 2000.

The memory controller 3200 may include a page buffer latch control module 1234 and a buffer memory 3300. The page buffer latch control module 1234 may control the data latch use operation of the page buffer latch input/output circuit 2000. The page buffer latch control module 1234 may use the data latches in the peripheral circuit 3115 of the flash memory 3100 like the buffer memory 3300 through a data latch use operation.

Figure 15:
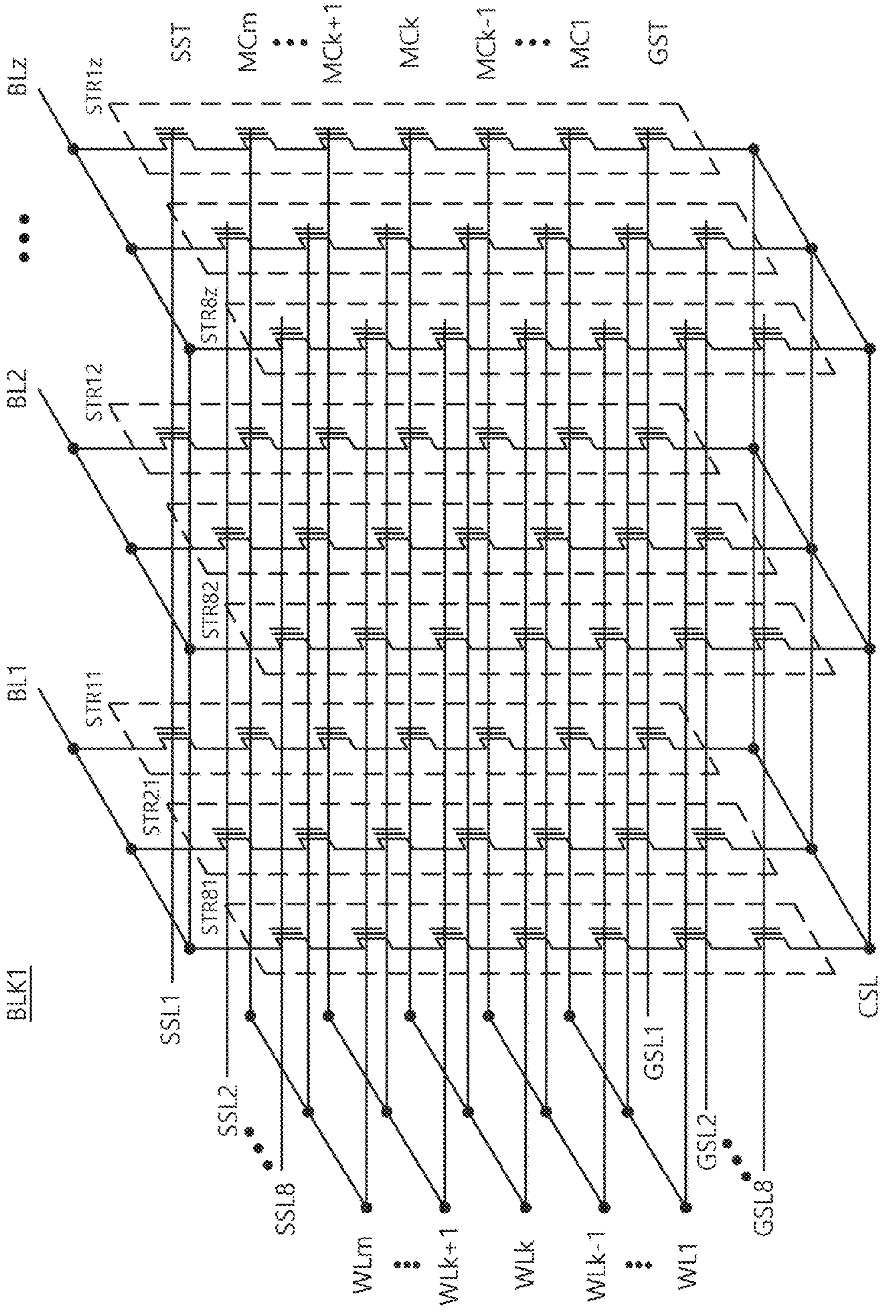
FIG. 15 is a circuit diagram illustrating an example of a memory block of a memory cell array.

FIG. 15 is a circuit diagram illustrating an example of a memory block BLK1 of a memory cell array, such as the memory cell array illustrated in FIG. 2 or FIG. 14. Referring to FIG. 15, in the memory block BLK1, a plurality of cell strings STR11 to STR8*z* may be formed between the bit lines BL1 to BLz and a common source line CSL. Each cell string includes a string selection transistor SST, a plurality of memory cells MC1 to MCm, and a ground selection transistor GST.

The string selection transistors SST may be connected with string selection lines SSL1 to SSL8. The ground selection transistors GST may be connected with ground selection lines GSL1 to GSL8. The string selection transistors SST may be connected with the bit lines BL1 to BLZ, and the ground selection transistors GST may be connected with the common source line CSL.

The first to m-th word lines WL1 to WLm may be connected with the plurality of memory cells MC1 to MCm in a row direction. The first to z-th bit lines BL1 to BLz may be connected with the plurality of memory cells MC1 to MCm in a column direction. First to z-th page buffers PB1 to PBz may be connected with the first to z-th bit lines BL1 to BLz.

The first word line WL1 may be placed above the first to eighth ground selection lines GSL1 to GSL8. The first memory cells MC1 that are placed at the same height from the substrate may be connected with the first word line WL1. The m-th word line WLm may be located below the first to eighth string selection lines SSL1 to SSL8. The m-th memory cells MCm located at the same height from the substrate may be connected to the m-th word line WLm. In a similar manner, the second to (m−1)-th memory cells MC2 to MCm−1 that are placed at the same heights from the substrate may be respectively connected with the second to (m−1)-th word lines WL2 to WLm−1, respectively.

Figure 16:
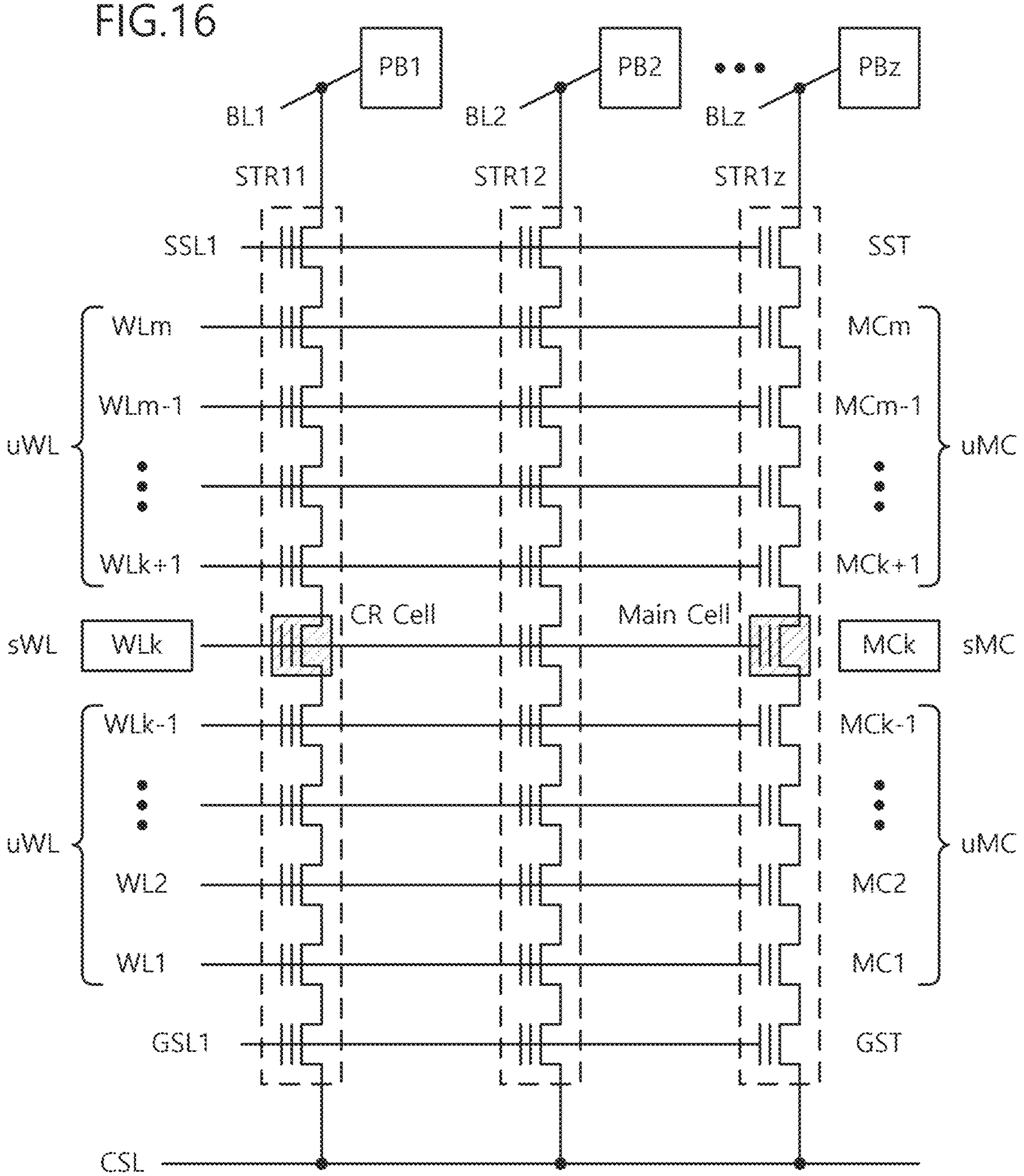
FIG. 16 is a circuit diagram illustrating examples of cell strings of a memory block.

FIG. 16 is a circuit diagram illustrating cell strings selected by the first string selection line SSL1 from among the cell strings of the memory block BLK1 illustrated in FIG. 15. The 11th to 1*z* cell strings STR11 to STR1*z* may be selected by the first string selection line SSL1. The 11th to 1*z* cell strings STR11 to STR1*z* may be connected to the first to z-th bit lines BL1 to BLz, respectively. The first to z-th page buffers PB1 to PBz may be connected to the first to z-th bit lines BL1 to BLz, respectively.

The 11th cell string STR11 may be connected to the first bit line BL1 and the common source line CSL. The 11th cell string STR11 may include string selection transistors SST selected by the first string selection line SSL1, first to m-th memory cells MC1 to MCm connected to the first to m-th word lines WL1 to WLm, and ground selection transistors GST selected by the first ground selection line GSL1. The 12th cell string STR12 may be connected to the second bit line BL2 and the common source line CSL. The 1*z* cell string STR1*z* may be connected to the z-th bit line BLz and the common source line CSL.

The first word line WL1 and the m-th word line WLm may be edge word lines (edge WL). The second word line WL2 and the (m−1)-th word line WLm−1 may be edge adjacent word lines. The k-th word line WLk may be a selected word line sWL. The (k−1)-th word line WLk−1 and the (k+1)-th word line WLk+1 may be adjacent word lines adjacent to the selected word line. If the k-th word line WLk is the selected word line sWL, the remaining word lines WL1 to WLk−1 and WLk+1 to WLm may be unselected word lines uWL.

The first memory cells MC1 and the m-th memory cells MCm may be edge memory cells. The second memory cells MC2 and the (m−1)-th memory cells MCm−1 may be edge adjacent memory cells. The k-th memory cells MCk may be selected memory cells sMC. The (k−1)-th memory cells MCk−1 and the (k+1)-th memory cells MCk+1 may be memory cells adjacent to the selected memory cells (adjacent MC). If the k-th memory cells MCk are selected memory cells sMC, the remaining memory cells MC1 to MCk−1 and MCk+1 to MCm may be unselected memory cells uMC.

A set of memory cells selected by one string selection line and connected to one word line may be one page. For example, memory cells selected by the first string selection line SSL1 and connected to the k-th word line WLk may be one page. For example, eight pages may be configured on the k-th word line WLk. Among the eight pages, a page connected to the first string selection line SSL1 is a selected page, and pages connected to the second to eighth string selection lines SSL2 to SSL8 are unselected pages.

Among the memory cells selected by the first string selection line SSL1 and connected to the k-th word line WLk, the memory cell connected to the first page buffer PB1 may be a column repair cell (CR Cell). The memory cell connected to the z-th page buffer (PBz) may be a main cell.

Figure 17:
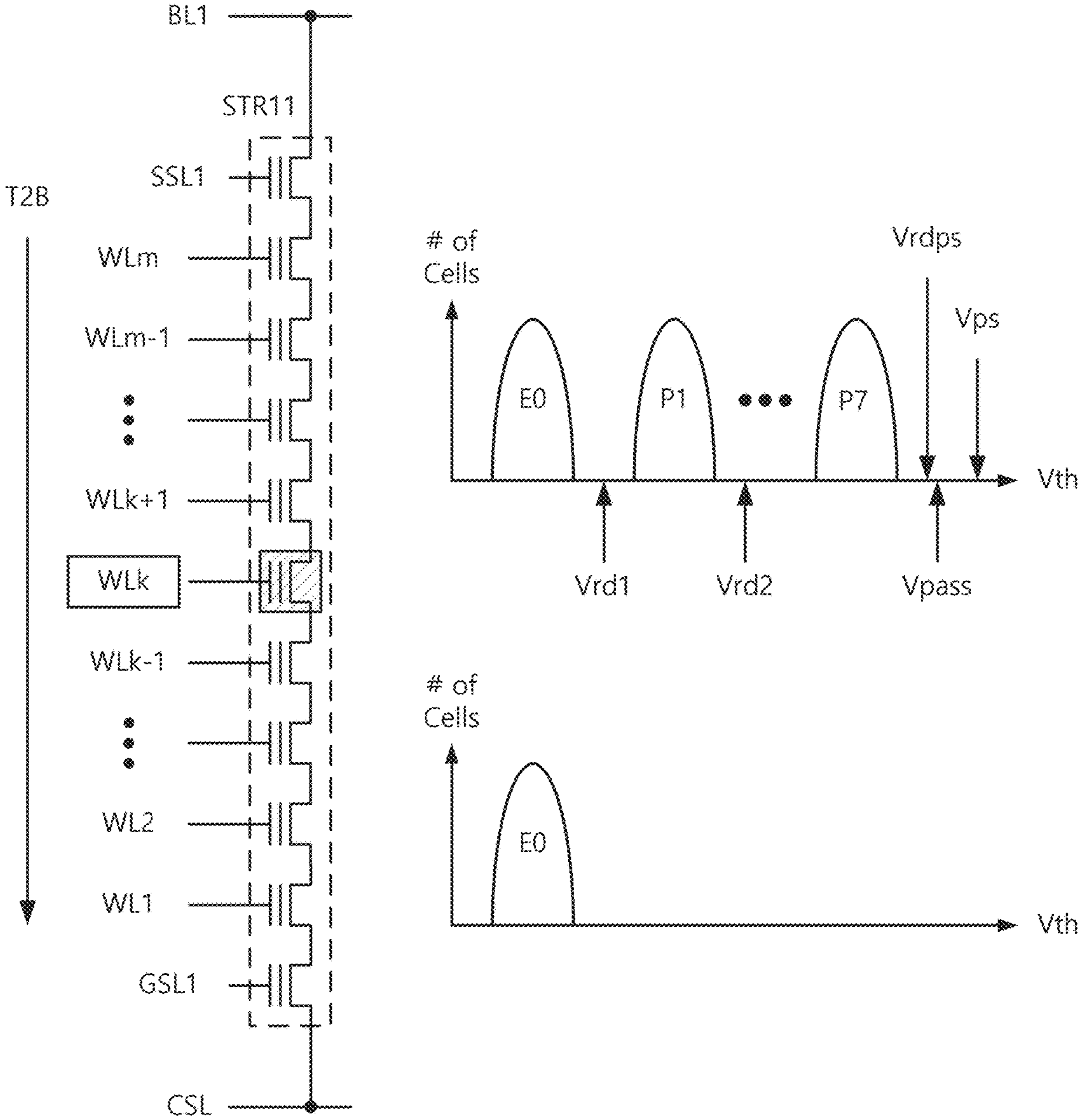
FIG. 17 is a diagram illustrating examples of threshold voltage distributions of memory cells illustrated in FIG. 16.

FIG. 17 is a diagram illustrating an example of threshold voltage distributions of memory cells, such as the memory cells illustrated in FIG. 16. The horizontal axis represents the threshold voltage Vth, and the vertical axis represents the number of memory cells.

FIG. 17 shows an example in which 3-bit data is stored in one memory cell. A 3-bit memory cell may have one of eight states (E0, P1 to P7) according to the threshold voltage distribution. E0 represents an erase state, and P1 to P7 represent program states.

During a read operation, the selection read voltages Vrd1 to Vrd7 may be provided to the selected word line sWL, and the pass voltage Vps and/or the read pass voltage Vrdps may be provided to the unselected word lines uWL. The pass voltage Vps and/or the read pass voltage Vrdps may be a voltage sufficient to turn on the memory cells. For example, the pass voltage Vps may be provided to the adjacent word lines WLk+1, and the read pass voltage Vrdps may be provided to the unselected word lines other than the adjacent word lines.

The first selection read voltage Vrd1 may be a voltage level between the erase state E0 and the first program state P1. The second selection read voltage Vrd2 may be a voltage level between the first and second program states P1 and P2. In this way, the seventh selection read voltage Vrd7 may be a voltage level between the sixth and seventh program states P6 and P7.

When the first selection read voltage Vrd1 is applied, the memory cell in the erase state E0 may be an on cell and the memory cell in the first to seventh program states P1 to P7 may be an off cell. When the second selection read voltage Vrd2 is applied, the memory cell in the erase state E0 and the first program state P1 may an on cell, and the memory cell in the second to seventh program states P2 to P7 may an off cell. In this way, when the seventh selection read voltage Vrd7 is applied, the memory cell in the erase state E0 and the first to sixth program states P1 to P6 may be an on cell and the memory cell in the seventh program state P7 may be an off cell.

During a read operation, the k-th word line WLk may be selected. A power supply voltage may be applied to the string selection line SSL1 and the ground selection line GSL1, and the string select transistor SST and the ground select transistor GST may be turned on. Also, the selection read voltage Vrd may be provided to the selected word line sWL, and the read pass voltage Vrdps and/or the pass voltage Vps may be provided to the unselected word lines uWL.

When the read operation of the k-th word line WLk is repeatedly performed, the high voltage read pass voltage Vrdps may be repeatedly provided to the remaining word lines. At this time, a read disturbance may occur in the remaining word lines, and thus the threshold voltage may be distorted. Memory cells connected to the k-th word line WLk may be off cells when a selection read voltage is provided. For example, when the threshold voltage of the k-th memory cell is higher than the selection read voltage, the k-th memory cell may be an off cell. When the k-th memory cell is an off cell, a channel may be separated at the k-th memory cell. For example, a lower channel of the k-th memory cell may receive a ground voltage from the common source line CSL, and an upper channel of the k-th memory cell may have a negative channel voltage.

A channel voltage difference may occur between a lower channel and an upper channel with the k-th memory cell interposed therebetween. Due to the channel voltage difference, hot carrier injection (HCI) may occur in an adjacent memory cells MCk+1 and/or MCk−1. For this reason, threshold voltages of memory cells connected to adjacent word lines WLk+1 and/or WLk−1 may be distorted. For example, the threshold voltages of memory cells in the erased state E0 may rise to enter the programmed state.

In the flash memory 3100, cell deterioration may occur due to read disturbance during the process of reading data stored in memory cells. If a high-voltage read pass voltage is repeatedly applied to an unselected word line, memory cells may be stressed. The threshold voltage of stressed memory cells may increase. As a result, a read failure may occur during a read operation.

The buffer memory of a mobile device may be insufficient. For example, the flash memory 3100 may provide hot data, which is frequently accessed in mobile devices with insufficient buffer memory, to the host without deteriorating memory cells. The storage device 3000 does not perform operations to program or read memory cells during a data latch use operation. Accordingly, the storage device 3000 may not only reduce cell deterioration (e.g., of the buffer memory 3300), but also provide data stored in the data latches to the host at high speed.

Figure 18:
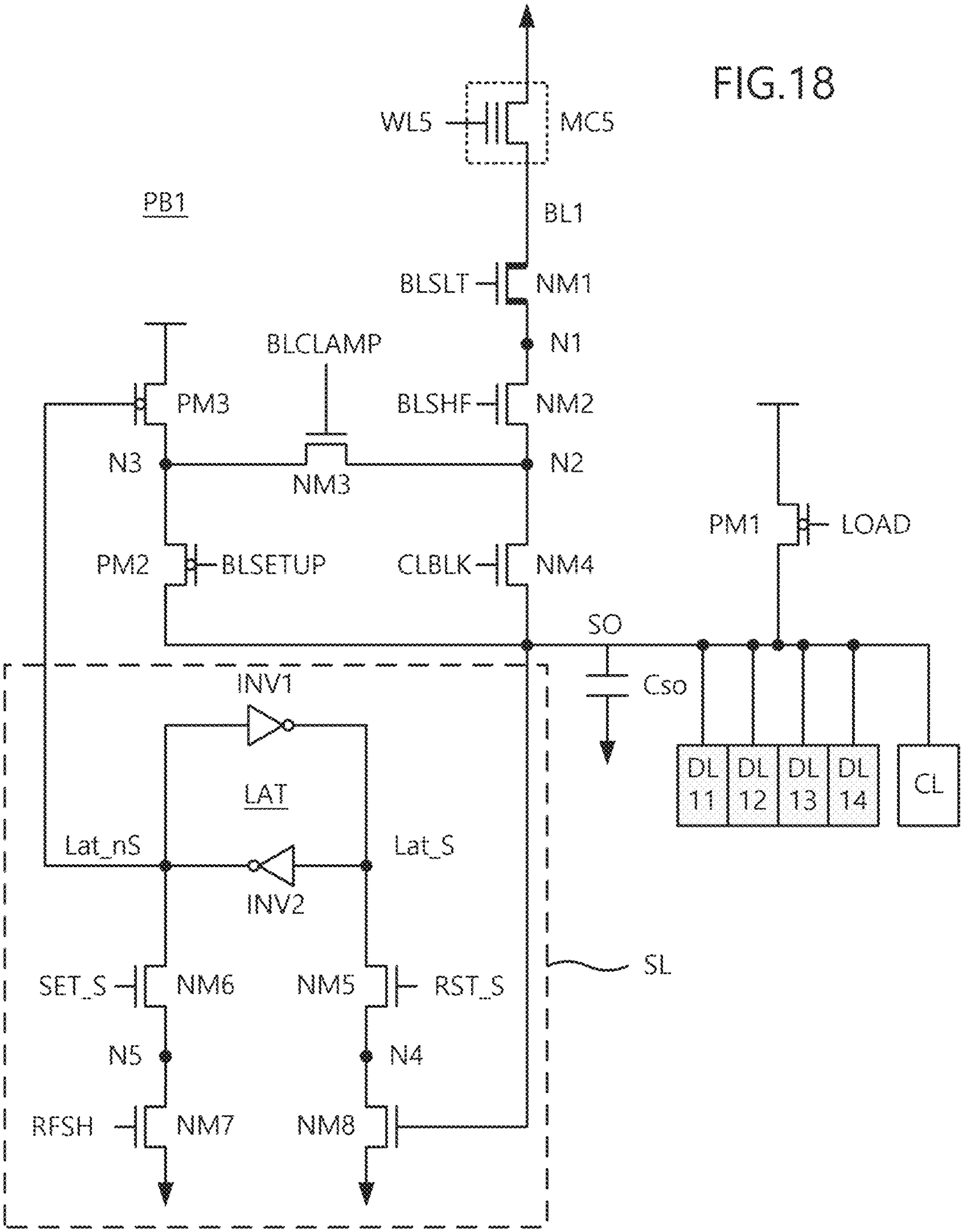
FIG. 18 is a circuit diagram illustrating an example of a page buffer.

FIG. 18 is a circuit diagram illustrating the first page buffer PB1 shown in FIG. 16. Referring to FIG. 18, the first page buffer PB1 is connected to the first bit line BL1. A fifth memory cell MC5 that is a selected memory cell sMC may be connected to the first bit line BL1. A fifth word line WL5 that is a selected word line sWL may be connected to the fifth memory cell MC5. The first bit line BL1 may be connected to the common source line CSL through the fifth memory cell MC5.

A first NMOS transistor NM1 may be included between the first bit line BL1 and the first node N1. The first NMOS transistor NM1 may be a bit line select transistor driven by the bit line select signal BLSLT. The bit line select transistor may be implemented as a high voltage transistor. The bit line select transistor may be disposed in the high voltage region.

A second NMOS transistor NM2 may be included between the first node N1 and the second node N2. The second NMOS transistor NM2 may be a bit line shut-off transistor driven by the bit line shut-off signal BLSHF. A third NMOS transistor NM3 may be included between the second node N2 and the third node N3. The third NMOS transistor NM3 may be a bit line clamping transistor driven by the bit line clamping control signal BLCLAMP. A fourth NMOS transistor NM4 may be included between the second node N2 and the sensing node SO. The fourth NMOS transistor NM4 may be a bit line connection transistor driven by the bit line connection control signal CLBLK.

A first PMOS transistor PM1 may be included between the sensing node SO and the power terminal. The first PMOS transistor PM1 may be a pre-charge load transistor driven by the load signal LOAD. A second PMOS transistor PM2 may be included between the sensing node SO and the third node NM3. The second PMOS transistor PM2 may be a bit line setup transistor driven by the bit line setup signal BLSETUP. A third PMOS transistor PM3 may be included between the third node NM3 and the power terminal. The third PMOS transistor PM3 may be a pre-charge transistor driven by the inverted latch node Lat_nS.

A sensing latch SL, a force latch FL, a most significant bit latch ML, and a least significant bit latch LL may be connected to the sensing node SO. The sensing latch SL may store data stored in the selected memory cell sMC or a sensing result of the threshold voltage of the selected memory cell sMC during a read or program verify operation. Also, the sensing latch SL may be used to apply a program bit line voltage or a program inhibit voltage to the first bit line BL1 during a program operation. The force latch FL may be used to improve threshold voltage distribution during a program operation. The most significant bit latch ML and the least significant bit latch LL may be utilized to store data inputted from the outside during a program operation.

The sensing latch SL may include a latch LAT connected between the latch node Lat_S and the inverted latch node Lat_nS. The latch LAT may include first and second inverters INV1 and INV2. An input terminal of the first inverter INV1 and an output terminal of the second inverter INV2 may be connected to the inverted latch node Lat_nS. An output terminal of the first inverter INV1 and an input terminal of the second inverter INV2 may be connected to the latch node Lat_S.

The inverted latch node Lat_nS may be connected to the gate terminal of the third PMOS transistor PM3. When the inverted latch node Lat_nS is at a low level, the third PMOS transistor PM3 may be turned on, and the third node N3 may become a power supply voltage level. When the inverted latch node Lat_nS is at a high level, the power terminal and the third node N3 may be cut off.

A fifth NMOS transistor NM5 may be included between the latch node Lat_S and the fourth node N4. The fifth NMOS transistor NM5 may be used to reset the latch node Lat_S in response to the latch reset signal RST_S. The latch reset signal RST_S may be provided from the control logic 1160. A sixth NMOS transistor NM6 may be included between the inverted latch node Lat_nS and the fifth node N5. The sixth NMOS transistor NM6 may be used to set the latch node Lat_S in response to the latch set signal SET_S. The latch set signal SET_S may be provided from the control logic 1160.

A seventh NMOS transistor NM7 may be included between the fifth node N5 and the ground terminal. The seventh NMOS transistor NM7 may adjust the voltage level of the fifth node N5 in response to the refresh signal RFSH. The refresh signal RFSH may be provided from the control logic 1160. An eighth NMOS transistor NM8 may be included between the fourth node N4 and the ground terminal. The eighth NMOS transistor NM8 may adjust the voltage level of the fourth node N4 in response to the voltage level of the sensing node SO.

Figure 19:
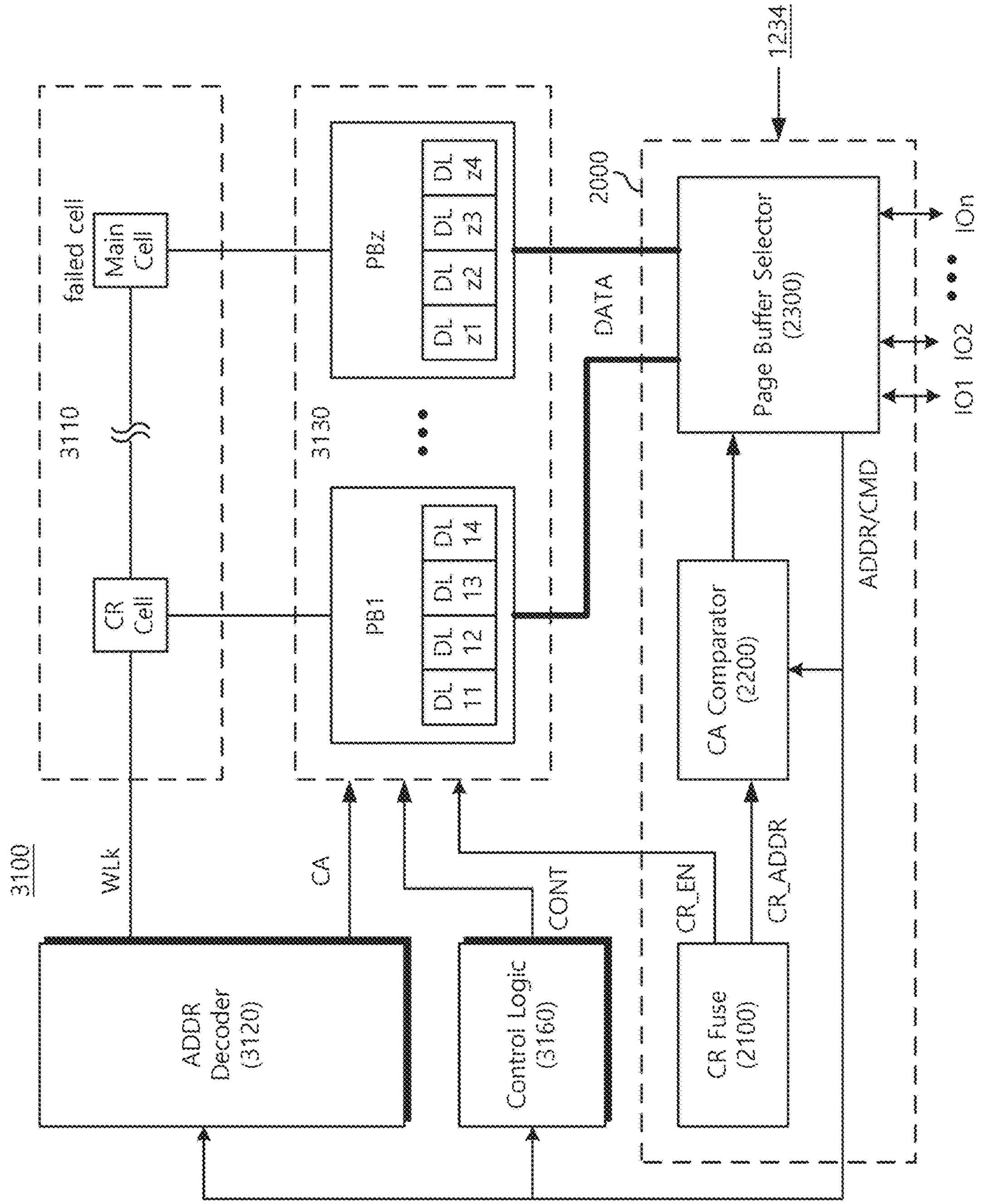
FIG. 19 is a block diagram illustrating an example of a page buffer latch input/output circuit.

FIG. 19 is a block diagram illustrating an example of a page buffer latch input/output circuit, e.g., the page buffer latch input/output circuit shown in FIG. 14. Referring to FIG. 19, the flash memory 3100 may include a memory cell array 3110, an address decoder 3120, a page buffer circuit 3130, a control logic 3160, and a page buffer latch input/output circuit 2000. The memory cell array 3110 may be connected to the address decoder 3120 through the k-th word line (WLk). A column repair cell (CR cell) and a main cell may be connected to the k-th word line (WLk).

The column repair page buffer (CR P/B) may include a plurality of page buffers. The plurality of page buffers may be divided into page buffers that perform a column repair operation and page buffers that do not perform a column repair operation.

Data to be stored in main cells may be stored in memory cells connected to page buffers that perform a column repair operation. Data may not be stored in memory cells connected to page buffers on which a column repair operation has not been performed. The flash memory 3100 may perform a data latch use operation using data latches of page buffers on which a column repair operation has not been performed.

Additionally, the flash memory 3100 does not conventionally use a page buffer connected to a failed cell (a "failed page buffer"). The flash memory 3100 may use the data latches of a failed page buffer through the page buffer latch input/output circuit 2000 as a substitute for the buffer memory 3300.

The page buffer circuit 3130 may include first to z-th page buffers (PB1 to PBz). The first page buffer PB1 may be a column repair page buffer connected to a column repair cell (CR cell). The z-th page buffer (PBz) may be a failed page buffer connected to a failed main cell.

The page buffer latch input/output circuit 2000 may use the data latches of the column repair page buffer (e.g., PB1) and the failed page buffer (e.g., PBz) of the page buffer circuit 3130 like a buffer memory 3300 through a data latch use operation. For example, the 11th to 14th data latches (DL11 to DL14) of the first page buffer PB1 and the z1-th to z4-th data latches (DLz1 to DLz4) of the z-th page buffer PBz may be used as a substitute for the buffer memory 3300.

The page buffer latch control module 1234 may control the data latch use operation of the page buffer latch input/output circuit 2000 on a failed page buffer unit basis and/or a column repair page buffer unit basis. The page buffer latch control module 1234 may use the data latches of the page buffer circuit 3130 like the buffer memory 3300 through a data latch use operation. By using the data latches of the page buffer circuit 3130 like the buffer memory 3300, the usability of the buffer memory 3300 may be increased.

Figure 20:
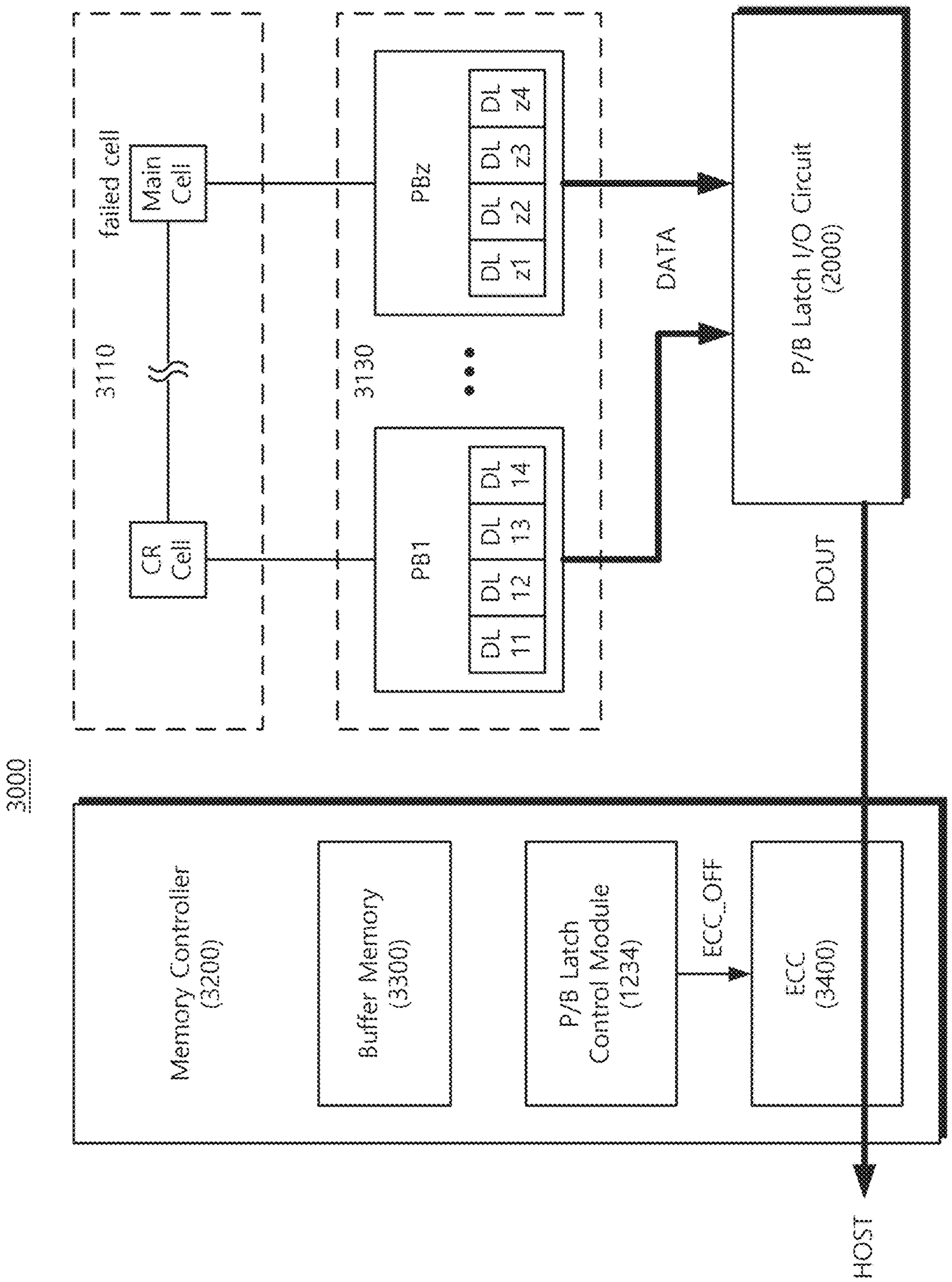
FIG. 20 is a block diagram illustrating an example of a device configuration in which data is provided to a host during a data latch use operation.

FIG. 20 is a block diagram illustrating an example of a configuration in which data is provided to the host during a data latch use operation, such as the operation shown in FIG. 19.

The storage device 3000 may store original data in data latches (e.g., DL11 to DL14, DLz1 to DLz4) during a data latch use operation. Here, the original data may be data provided from the host or data on which ECC or Randomizer has been performed. Error-free data may be stored in the data latches of the page buffer circuit 3130 because it goes through ECC or randomizer.

The storage device 3000 may output data stored in the data latches of the page buffer circuit 3130 to the host through the page buffer latch input/output circuit 2000 without performing a separate read operation during a data latch use operation. Data output from the page buffer latch input/output circuit 2000 may be original data that has not been programed in/read from memory cells of the flash memory 3100. Therefore, the memory controller 3200 may not perform an ECC operation.

The page buffer latch control module 1234 may provide an ECC_OFF signal to the ECC circuit 3400 while data (DOUT) is output from the page buffer latch input/output circuit 2000. The ECC circuit 3400 may receive the ECC_OFF signal and not perform an ECC operation. Output data (DOUT) may be provided directly to the host.

Figure 21:
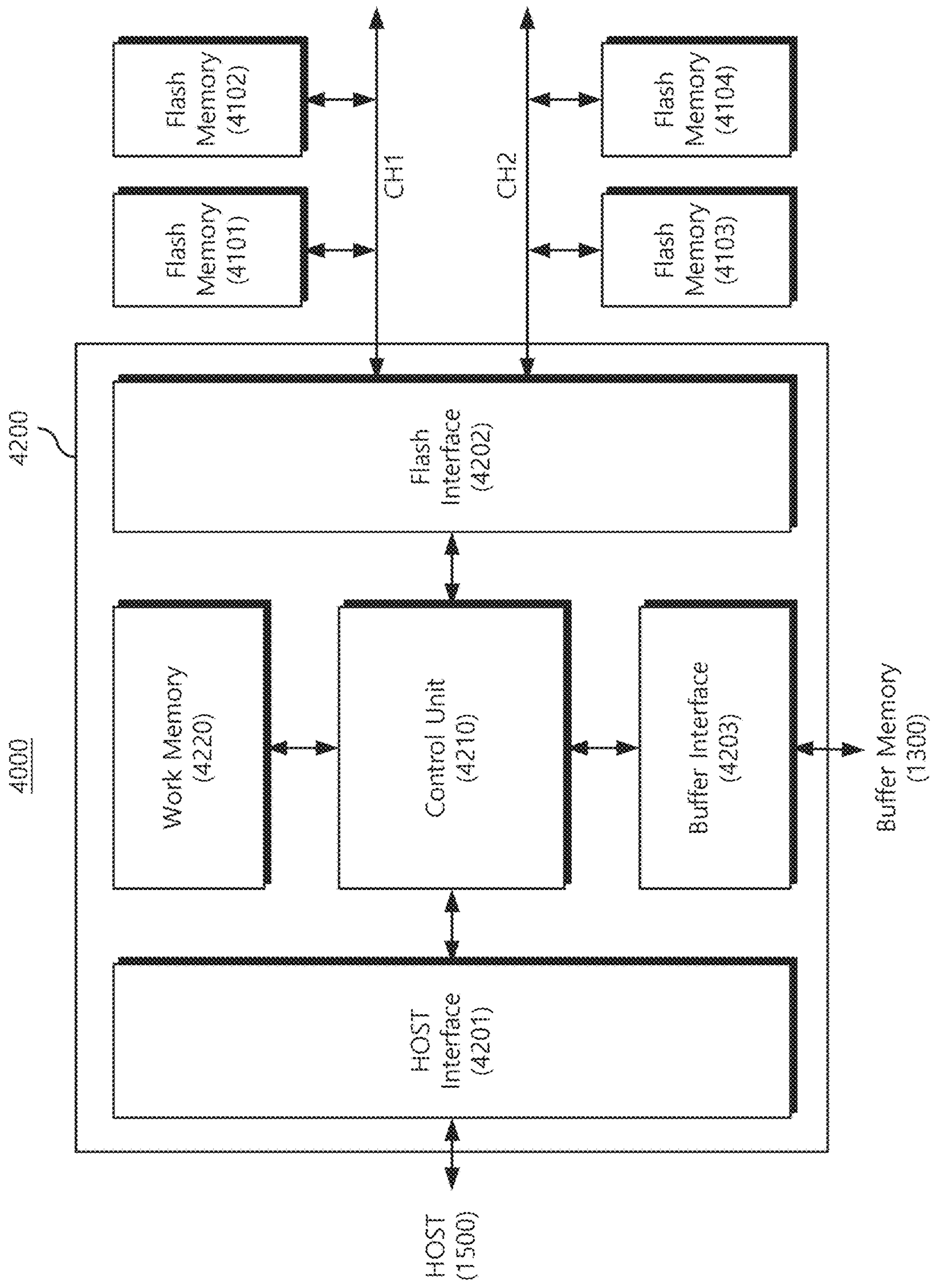
FIG. 21 is a block diagram illustrating an example in which a storage device is implemented with a solid state drive (SSD).

FIG. 21 is a block diagram illustrating an example in which a storage device is implemented with a solid state drive (SSD). Referring to FIG. 21, an SSD 4000 may include a plurality of flash memories 4101 to 4104 and an SSD controller 4200.

The first and second flash memories 4101 and 4102 may be connected with the SSD controller 4200 through a first channel CH1. The third and fourth flash memories 4103 and 4104 may be connected with the SSD controller 4200 through a second channel CH2. The number of channels connected with the SSD controller 4200 may be two or more. The number of flash memories connected with one channel may be two or more.

The SSD controller 4200 may include a host interface 4201, a flash interface 4202, a buffer interface 4203, a control unit 4210, and a work memory 4220. The SSD controller 4200 may be connected with a host 1500 through the host interface 4201. Depending on a request of the host 1500, the SSD controller 4200 may write data in the corresponding flash memory or may read data from the corresponding flash memory.

The SSD controller 4200 may be connected with the plurality of flash memories 4101 to 4104 through the flash interface 4202 and may be connected with a buffer memory 1300 through the buffer interface 4203. The flash interface 4202 may provide data, which are temporarily stored in the buffer memory 1300, to the flash memories through the channels CH1 and CH2. The flash interface 4202 may transfer the data read from the flash memories 4101 to 4104 to the buffer memory 1300.

The control unit 4210 may analyze and process the signal received from the host 1500. The control unit 4210 may control the host 1500 or the flash memories 4101 to 4104 through the host interface 4201 or the flash interface 4202. The control unit 4210 may control operations of the flash memories 4101 to 4104 by using firmware for driving the SSD 4000.

The SSD controller 4200 may manage data to be stored in the flash memories 4101 to 4104. In a sudden power-off event, the SSD controller 4200 may back up the data stored in the work memory 4220 or the buffer memory 1300 to the flash memories 4101 to 4104.

The SSD controller 4200 can be configured to use data latches of the flash memories 4101 to 4104 as described in reference to FIGS. 1-20.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the con text of a single implementation can also be implemented in multiple implementations separately or in any suitable subcombination. Moreover, although features may be described above as acting in certain combinations, one or more features from a combination can in some cases be excised f rom the combination, and the combination may be directed to a subcombination or variation of a subcombination.

While the present disclosure has been described with reference to various examples, it will be apparent to those of ordinary skill in the art that various changes and modifications may be made thereto without departing from the spirit and scope of the present disclosure.

What is claimed is:

1. A memory device comprising:

a memory cell array including a first memory cell for storing user data and a second memory cell for performing a column repair on the first memory cell;

a page buffer circuit including a first page buffer connected to the first memory cell and a second page buffer connected to the second memory cell; and a page buffer latch input/output circuit configured to use at least one data latch of the second page buffer as a substitute for a buffer memory of a memory controller in a data latch use operation, wherein the page buffer latch input/output circuit is configured to receive a data latch use mode signal from the memory controller and perform the data latch use operation based on the data latch use mode signal.

2. The memory device of claim 1, wherein the page buffer latch input/output circuit comprises:

a column repair fuse circuit configured to store address information of the first and second memory cells;

a column address comparator configured to compare an address of the first memory cell with an input address, and generate an address comparison signal based on a result of the comparison; and a page buffer selector configured to select the second page buffer based on the address comparison signal.

3. The memory device of claim 2, wherein the page buffer selector is configured to store data in the at least one data latch of the second page buffer during the data latch use operation.

4. The memory device of claim 3, wherein the column repair fuse circuit is configured to control the second page buffer so that no data is stored in the second memory cell during the data latch use operation.

5. The memory device of claim 1, wherein the page buffer latch input/output circuit is configured to perform the data latch use operation using a data unit having a predetermined bit size, wherein, in the data latch use operation, the page buffer latch input/output circuit is configured to store the data unit in a plurality of page buffers simultaneously, the plurality of page buffers including the second page buffer, and wherein the plurality of page buffers have a storage size corresponding to the predetermined bit size.

6. The memory device of claim 1, wherein the first and second memory cells are flash memory cells.

7. The memory device of claim 6, wherein the first and second memory cells each store multi-bit data, and wherein each of the first and second page buffers includes a plurality of data latches for storing the multi-bit data.

8. A memory device comprising:

a memory cell array including a first memory cell for storing user data and a second memory cell for performing a column repair on the first memory cell;

a page buffer circuit including a first page buffer connected to the first memory cell and a second page buffer connected to the second memory cell; and a page buffer latch input/output circuit configured to, in a data latch use operation, use at least one data latch of the first page buffer as a substitute for a buffer memory of a memory controller when the first memory cell is failed, wherein the page buffer latch input/output circuit is configured to receive a data latch use mode signal from the memory controller and perform the data latch use operation based on the data latch use mode signal.

9. The memory device of claim 8, wherein the page buffer latch input/output circuit comprises:

a column repair fuse circuit configured to store address information of the first and second memory cells;

a column address comparator configured to compare an address of the first memory cell with an input address, and generate an address comparison signal based on the comparison; and a page buffer selector configured to select the second page buffer based on the address comparison signal during the data latch use operation.

10. The memory device of claim 9, wherein the page buffer selector is configured to store data in the at least one data latch of the first page buffer during the data latch use operation.

11. The memory device of claim 10, wherein the column repair fuse circuit is configured to control the first page buffer so that no data is stored in the first memory cell during the data latch use operation.

12. The memory device of claim 8, wherein the page buffer latch input/output circuit is configured to perform the data latch use operation using a data unit having a predetermined bit size, wherein, in the data latch use operation, the page buffer latch input/output circuit is configured to store the data unit in a plurality of page buffers simultaneously, the plurality of page buffers including the first page buffer, and wherein the plurality of page buffers have a storage size corresponding to the predetermined bit size.

13. A storage device comprising:

a memory device including a first memory cell for storing a user data, a second memory cell for performing a column repair on the first memory cell, a first page buffer connected to the first memory cell, and a second page buffer connected to the second memory cell; and a memory controller configured to control the memory device to use at least one data latch of the first page buffer or the second page buffer as a substitute for a buffer memory of the memory controller in a data latch use operation, wherein the memory device is configured to receive a data latch use mode signal from the memory controller and perform the data latch use operation based on the data latch use mode signal.

14. The storage device of claim 13, wherein the memory device comprises:

a column repair fuse circuit configured to store address information of the first and second memory cells;

a column address comparator configured to compare an address of the first memory cell with an input address, and generate an address comparison signal based on the comparison; and a page buffer selector configured to select the second page buffer based on the address comparison signal.

15. The storage device of claim 14, wherein the page buffer selector is configured to store data in the at least one data latch of the first page buffer or the second page buffer during the data latch use operation.

16. The storage device of claim 15, wherein the column repair fuse circuit is configured to control the first page buffer or the second page buffer so that no data is stored in the first memory cell or the second memory cell during the data latch use operation.

17. The storage device of claim 14, wherein the page buffer selector is configured to perform the data latch use operation using a data unit having a predetermined bit size, wherein the page buffer selector is configured to store the data unit in a plurality of page buffers simultaneously, the plurality of page buffers including the first page buffer or the second page buffer, and wherein the plurality of page buffers have a storage size corresponding to the predetermined bit size.

18. The storage device of claim 13, wherein the memory controller comprises a page buffer latch control module, and wherein the page buffer latch control module is configured to control the memory device to perform the data latch use operation.

19. The storage device of claim 18, wherein the page buffer latch control module is configured to provide data from the at least one data latch of the first page buffer or the second page buffer used the substitute for the buffer memory to a host without performing an error correction code (ECC) operation.

* * * * *